US007553728B2

(12) United States Patent
Mizukami et al.

(10) Patent No.: US 7,553,728 B2
(45) Date of Patent: Jun. 30, 2009

(54) METHOD OF FABRICATING A NON-VOLATILE SEMICONDUCTOR MEMORY

(75) Inventors: Makoto Mizukami, Kawasaki (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/206,762

(22) Filed: Sep. 9, 2008

(65) Prior Publication Data

US 2009/0011559 A1    Jan. 8, 2009

Related U.S. Application Data

(62) Division of application No. 11/608,393, filed on Dec. 8, 2006, now Pat. No. 7,432,561.

(30) Foreign Application Priority Data

Dec. 19, 2005  (JP) ............................... 2005-365466

(51) Int. Cl.
*H01L 21/336* (2006.01)
*H01L 27/108* (2006.01)

(52) U.S. Cl. .................. 438/257; 257/315; 257/390; 257/E29.129; 257/E21.422; 257/E21.179; 257/E21.68

(58) Field of Classification Search ............ None
See application file for complete search history.

(56) References Cited

U.S. PATENT DOCUMENTS

| 5,814,854 | A | 9/1998 | Liu et al. |
| 6,525,367 | B1 * | 2/2003 | Moriyama ................. 257/314 |
| 7,120,057 | B2 * | 10/2006 | Umezawa et al. ...... 365/185.18 |
| 2003/0034520 | A1 * | 2/2003 | Kusunoki ................. 257/344 |
| 2004/0166621 | A1 * | 8/2004 | Forbes ....................... 438/200 |
| 2007/0128815 | A1 * | 6/2007 | Iino et al. .................. 438/297 |

FOREIGN PATENT DOCUMENTS

| JP | 11-163303 | 6/1999 |
| JP | 2000-174241 | 6/2000 |

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

An non-volatile semiconductor memory having a linear arrangement of a plurality of memory cell transistors, includes: a first semiconductor layer having a first conductivity type; a second semiconductor layer provided on the first semiconductor layer to prevent diffusion of impurities from the first semiconductor layer to regions above the second semiconductor layer; and a third semiconductor layer provided on the second semiconductor layer, including a first source region having a second conductivity type, a first drain regions having the second conductivity type and a first channel region having the second conductivity type for each of the memory cell transistors.

2 Claims, 37 Drawing Sheets

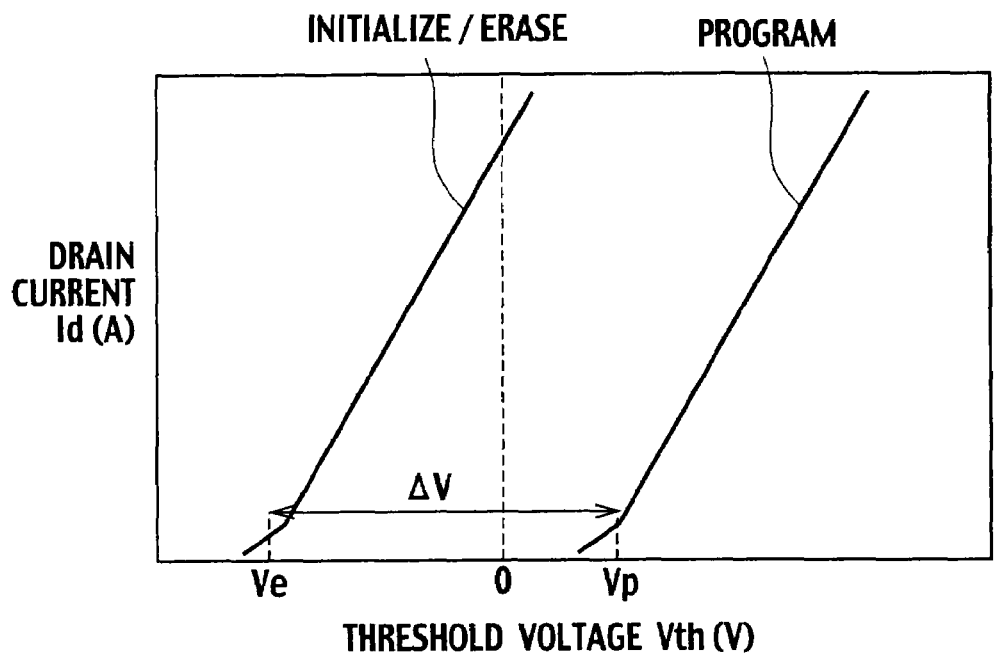

CHANNEL CURRENT

METHOD OF FABRICATING A NON-VOLATILE SEMICONDUCTOR MEMORY

CROSS REFERENCE TO RELATED APPLICATIONS AND INCORPORATION BY REFERENCE

This application is a Division of and claims the benefit of priority under 35 U.S.C. §120 from U.S. Ser. No. 11/608,393, filed Dec. 8, 2006, and claims the benefit of priority under 35 U.S.C. §119 from Japanese Patent Application No. P2005-365466, filed Dec. 19, 2005, the entire contents of each which are incorporated herein by reference.

BACKGROUND OF THE INVENTION

1. Field of the Invention

This present invention relates to a non-volatile semiconductor memory and a method for manufacturing the same.

2. Description of the Related Art

An electrically erasable programmable read-only memory (EEPROM) is known as a non-volatile semiconductor memory. In the EEPROM, a cell array is configured in such a way that a memory cell transistor is arranged at an intersection where a word line in the row direction and a bit line in the column direction cross over each other. Among EEPROMs, the NAND flash EEPROM in which a plurality of memory cell transistors are connected in series, and which can erase all the written data simultaneously, has been in wide use.

A memory cell transistor of the NAND type flash EEPROM includes n-type source and drain regions; and a p channel region between the source and drain regions. A stacked gate structure is formed on the channel region in which a control gate electrode and a floating gate electrode are stacked.

As the memory cell transistor has been minaturized, an interval between the source and drain regions of the memory cell transistor has become so narrow that influence of the short channel effect has increased in the NAND flash EEPROM.

SUMMARY OF THE INVENTION

The present invention provides a non-volatile semiconductor memory and a method for manufacturing thereof which can decrease a short channel effect of a memory cell transistor.

An aspect of the present invention inheres in a non-volatile semiconductor memory having a linear arrangement of a plurality of memory cell transistors, including: a first semiconductor layer having a first conductivity type; a second semiconductor layer provided on the first semiconductor layer so as to prevent diffusion of impurities from the first semiconductor layer to regions above the second semiconductor layer; and a third semiconductor layer provided on the second semiconductor layer, including a first source region having a second conductivity type, a first drain region having the second conductivity type, and a first channel region having the second conductivity type between the first source and drain regions for each of the memory cell transistors so as to establish the linear arrangement.

Another aspect of the present invention inheres in a method for manufacturing a non-volatile semiconductor memory including: forming a second semiconductor layer on a first semiconductor layer having a first conductivity type; forming a third semiconductor layer having a second conductivity type on the second semiconductor layer; forming a gate insulating film on the third semiconductor layer; depositing a first conductive layer on the gate insulating film; depositing an insulating film on the first conductive layer; depositing a second conductive layer on the insulating film; forming a groove penetrating the second conductive layer, the insulating layer and the first conductive layer so as to define a control gate electrode, an inter-electrode insulating film under the control gate electrode and a floating gate electrode under the inter-electrode insulating film; and forming a memory cell transistor comprising a source region having the second conductivity type, a drain region having the second conductivity type and a channel region having the second conductivity type on the third semiconductor layer by ion implantation to the third semiconductor layer through the groove.

BRIEF DESCRIPTION OF DRAWINGS

FIG. 5 is a graph showing an example of I-V characteristic of a memory cell transistor of the non-volatile semiconductor memory according to the embodiment of the present invention.

FIG. 6 is a graph showing an example of operation voltage being supplied to a line of the cell array of the non-volatile semiconductor memory according to the embodiment of the present invention.

DETAILED DESCRIPTION OF THE INVENTION

Figure 1:
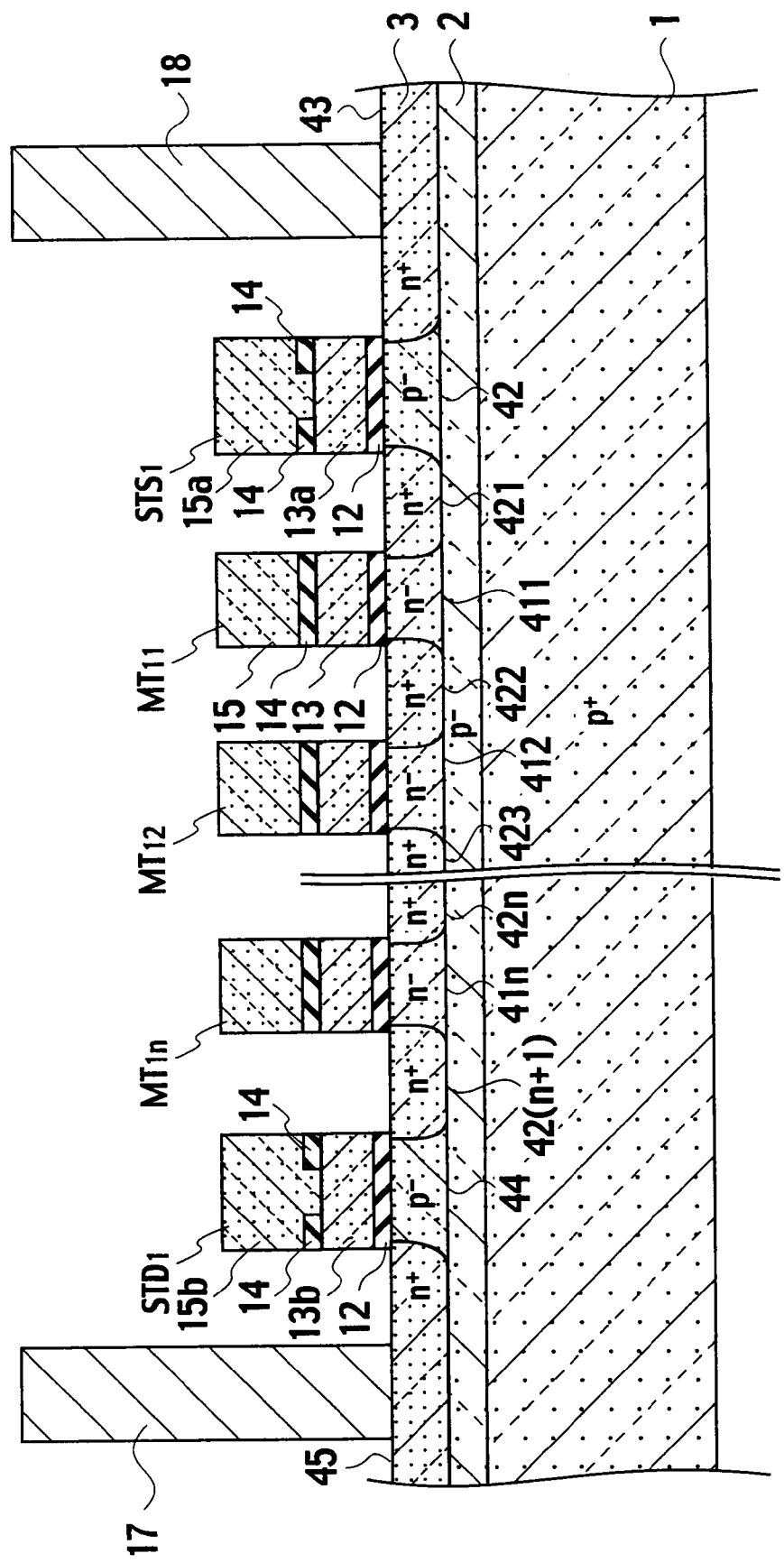
FIG. 1 is a cross-sectional view in the column direction showing an example of a cell array of a non-volatile semiconductor memory according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the embodiment of the present invention, the "first conductivity type" and "second conductivity type" are mutual opposites. In other words, when the first conductivity type is an n-type then the second conductivity type will be a p-type, and vice versa. Below, the case with the first conductivity type as a p-type and the second conductivity type as an n-type will be described. However, another case with the first conductivity type as an n-type and the second conductivity type as a p-type is also contemplated. When n-type and p-type conductivities are changed to the opposite type, polarizations of applied voltages are also oppositely changed.

A non-volatile semiconductor memory according to an embodiment of the present invention is an NAND flash EEPROM in which a plurality of memory cell transistors are arranged in a matrix. As shown in FIG. 1, the non-volatile semiconductor memory includes: a first semiconductor layer (semiconductor substrate) 1 having a first conductivity type ($p^+$-type); a second semiconductor layer 2 provided on the first semiconductor layer 1 so as to prevent a diffusion of impurities from the first semiconductor layer 1 to regions above the second semiconductor layer 2; and a third semiconductor layer 3 provided on the second semiconductor layer 2. source regions (first source regions) 421 to 42n having a second conductivity ($n^+$) type, drain regions (first drain regions) 422 to 42(n+1) having a second conductivity ($n^+$) type, and channel regions (first channel regions) 411 to 41$n$ having a second conductivity ($n^-$) type between the source regions 421 to 42n and the drain regions 422 to 42(n+1) for each of the pluraliry memory cell transistors $MT_{11}$ to $MT_{1n}$ that are provided periodically in the third semiconductor layer 3.

Figure 2:
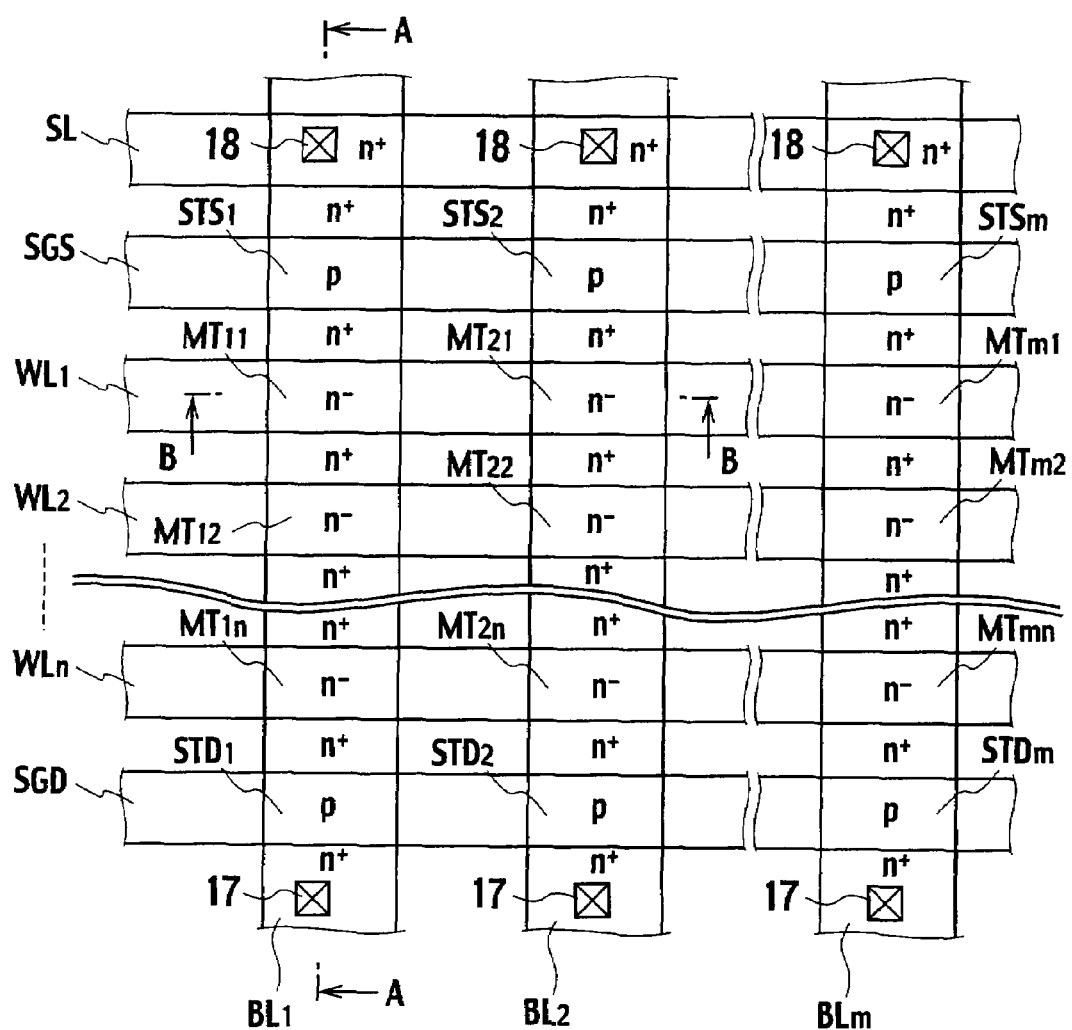
FIG. 2 is a plan view showing an example of the cell array of the non-volatile semiconductor memory according to the embodiment of the present invention.

FIG. 1 is a cross-sectional view of the non-volatile semiconductor memory taken along the I-I line in the column direction, as shown in FIG. 2. In FIG. 1, for example, n (n is an integer) memory cell transistors $MT_{11}$ to $MT_{1n}$ are arranged in the column direction so as to be adjacent to one another. Each of the memory cell transistors $Mt_{11}$ to $MT_{1n}$ includes a stacked gate structure in which the floating gate electrodes 13 and the control gate electrodes 15 are stacked.

For example, the memory cell transistor $MT_{11}$ includes: the source and drain regions 421 and 422 having $n^+$-type conductivity disposed in the third semiconductor layer 3; the channel regions 411 having $n^-$-type conductivity interposed between the source and drain regions 421 and 422; the floating gate electrode 13 insulated and provided on the channel regions 411; and the control gate electrode 15 insulated and provided on the floating gate electrode 13. The memory cell transistor $MT_{12}$ includes: the source and drain regions 422 and 423 having $n^+$-type conductivity disposed in the third semiconductor layer 3; the channel regions 412 having $n^-$-type conductivity interposed between the source and drain regions 422 and 423; the floating gate electrode 13 insulated and provided on the channel regions 412; and the control gate electrode 15 insulated and provided on the floating gate electrode 13. The memory cell transistor $MT_{1n}$ includes: the source and drain regions 42$n$ and 42(n+1) having $n^+$-type conductivity disposed in the third semiconductor layer 3; the channel regions 41$n$ having $n^-$-type conductivity interposed between the source and drain regions 42n and 42(n+1); the floating gate electrode 13 insulated and provided on the channel regions 41$n$; and the control gate electrode 15 insulated and provided on the floating gate electrode 13.

A floating gate electrode 13 is disposed on each of the channel regions 411 to 41$n$ with a gate insulating film (tunnel oxide film) 12 interposed there between. A control gate electrode 15 is disposed on each of the floating gate electrodes 13 with an interelectrode insulating film 14 interposed there between.

The source and drain regions 421 to 42(n+1) are shared by the memory cell transistors $MT_{11}$ to $MT_{1n}$, adjacent to each other in the column direction. "Shared region" refers to a common region which functions in a way that a source region for a memory cell transistor serves as a drain region for an adjacent memory cell transistor. For example, the drain region 422 of one memory cell transistor $MT_{11}$ serves as the source region 422 of another memory cell transistor $MT_{12}$, adjacent to the memory cell transistor $MT_{11}$. The memory cell transistors $MT_{11}$ to $MT_{mn}$ are arranged in a plurality of parallel columns so that the source regions 421 to 42$n$, the channel regions 411 to 41$n$ and the drain regions 422 to 42(n+1) are isolated from the corresponding source regions, channel regions and drain regions in other columns.

Each of the memory cell transistors $Mt_{11}$ to $MT_{1n}$ is a depletion mode MIS transistor or enhancement mode MIS transistor. The "MIS transistor" is an insulated gate transistor, such as a field effect transistor (FET) and a static induction transistor (SIT), which controls channel current by gate voltage through an insulating film (gate insulating film) interposed between a gate electrode and a channel region. A MISFET in which a silicon oxide film ($SiO_2$ film) is used as a gate insulating film is referred to as a metal oxide semiconductor field effect transistor (MOSFET).

Whether the memory cell transistors $MT_{11}$ to $MT_{1n}$ are depletion mode or enhancement mode is determined by the extent of the depletion layer in the channel regions $41_1$ to $41_n$ at thermal equilibrium state. When the channel regions $41_1$ to $41_n$ are not depleted entirely in a thermal equilibrium state, that is, the channel regions $41_1$ to $41_n$ are partially depleted, or are not depleted and leave a conductive layer in the channel regions $41_1$ to $41_n$ of the memory cell transistors $MT_{11}$ to $MT_{1n}$ are depletion mode transistors. On the other hand, when the channel regions $41_1$ to $41_n$ are depletioned entirely at thermal equilibrium state, the memory cell transistors $MT_{11}$ to $MT_{1n}$ are enhancement mode transistors. Whether the channel regions $41_1$ to $41_n$ are entirely depleted or leave a conductive layer at thermal equilibrium state is determined by an impurity concentration and thickness of the channel regions $41_1$ to $41_n$, and can be adjusted appropriately.

In addition, $SiO_2$, silicon nitride ($Si_3N_4$), tantalum oxide ($Ta_2O_5$), titanium oxide ($TiO_2$), alumina ($Al_2O_3$), zirconium oxide ($ZrO_2$) and the like can be used as a material for the gate insulating film of the MIS transistor.

$Si_3N_4$, $Ta_2O_5$, $TiO_2$, $Al_2O_3$, $ZrO_2$, oxide/nitride/oxide (ONO) phosphor silicate glass (PSG), boron phosphor silicate glass (BPSG), silicon oxide nitride (SiON), barium titanate ($BaTiO_3$), silicon oxide fluoride ($SiO_xF_x$), and organic resins such as polyimide can be used as materials for the inter-electrode insulating film 14.

The first semiconductor layer 1 is, for example, a silicone (Si) substrate. The second semiconductor layer 2 serves to prevent an upward diffusion of impurities from the first semiconductor layer 1 to regions above the second semiconductor layer 2. The second semiconductor layer 2 is, for example, a $p^-$-type epitaxial layer having with an impurity concentration lower than the impurity concentration of the first semiconductor layer 1. The third semiconductor layer 3 is, for example, an epitaxial layer. In the third semiconductor layer 3, the source and dorain regions $42_1$ to $42(n+1)$, the channel regions $41_1$ to $41_n$ and the like are provided.

Each of two select gate transistors $STS_1$ and $STD_1$ is arranged in, and neighbouring to, each end of the column direction of the memory cell transistors $MT_{11}$ to $MT_{1n}$. The select gate transistor $STS_1$ is an enhancement MIS transistor including: a $n^+$-type drain region (second drain region) $42_1$ which is common to a source region $42_1$ of the memory cell transistor $MT_{11}$ positioned in one end of the linear arrangement of the memory cell transistors $MT_{11}$ to $MT_{1n}$ in the column direction; a p-type channel region (second channel region) 42 arranged so as to be adjacent to the drain region $42_1$; a $n^+$-type source region (second source region) 43 arranged so as to be adjacent to the channel region 42; and select gate electrodes 13a and 15a arranged above the channel region 42 with the gate insulating film 12 interposed between the channel region 42 and the set of select gate electrodes 13a and 15a. The drain region $42_1$, the channel region 42 and the source region 43 are arranged in the third semiconductor layer 3. A source line contact plug 18 is arranged on the source region 43 so that the source line contact plug 18 is adjacent to the select gate transistor $STS_1$.

Alternatively, the select gate transistor $STD_1$ is an enhancement MIS transistor including: a $n^+$-type source region (third source region) $42(n+1)$ which is common to a drain region $42(n+1)$ of the memory cell transistor $MT_{1n}$ positioned in another end of the linear arrangement of the memory cell transistors $MT_{11}$ to $MT_{1n}$ in the column direction; a p-type channel region (third channel region) 44 arranged so as to be adjacent to the source region $42(n+1)$; a $n^+$-type drain region (third drain region) 45 arranged so as to be adjacent to the channel region 44; select gate electrodes 13b and 15b arranged above the channel region 44 with the gate insulating film 12 interposed between the channel region 44 and the set of select gate electrodes 13b and 15b. The source region $42(n+1)$, the channel region 44 and the drain region 45 are arranged in the third semiconductor layer 3. A bit line contact plug 17 is arranged on the drain region 45 so that the bit line contact plug 17 is adjacent to the select gate transistor $STD_1$.

FIG. 2 shows m×n (m and n are integers) memory cell transistors $MT_{11}$ to $MT_{1n}$, $MT_{21}$ to $MT_{2n}$, ..., $MT_{m1}$ to $MT_{mn}$ provided in a matrix. As shown in FIG. 2, the following elements are arranged in the column direction of a cell array in the non-volatile semiconductor memory according to the present embodiment: a source line SL connected to the source line contact plug 18; a select gate line SGS connected to the select gate electrodes 13a and 15a of a select gate transistor $STS_1$; word lines $WL_1$ to $WL_n$ connected to the control gate electrodes 15 of the respective memory cell transistors $MT_{11}$ to $MT_{1n}$; and a select gate line SGD connected to the select gate electrodes 13b and 15b of the select gate transistor $STD_1$. Bit lines $BL_1, BL_2, \ldots, BL_m$, connected to the bit line contact plug 17, are arranged in the row direction so as to extend in the column direction.

Figure 3:
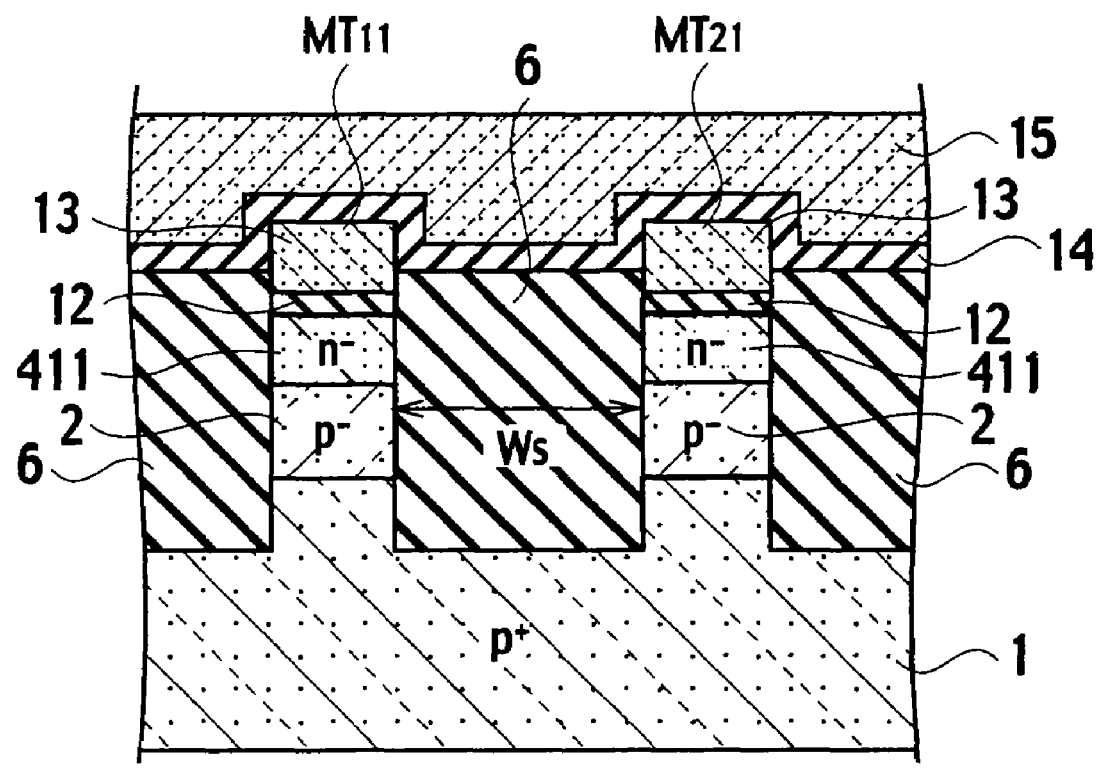
FIG. 3 is a cross-sectional view in the row direction showing an example of the cell array of the non-volatile semiconductor memory according to the embodiment of the present invention.

FIG. 3 is a cross-sectional view of the non-volatile semiconductor memory taken along the II-II line in the row direction shown in FIG. 2. As shown in FIG. 3, an element isolation insulating film 6 is buried between the floating gate electrode 13 and the channel region 41 of each of the memory cell transistors $MT_{11}$ and $MT_{21}$, which are adjacent to one another in the row direction. Elements of the respective memory cell transistors $MT_{11}$ and $MT_{21}$, which are adjacent to one another in the row direction, are completely isolated from one another by element isolation insulating film 6. A peripheral circuit of a cell array, arranged on the first semiconductor layer 1, is further provided on the outside of the cell array that comprises of a plurality of memory cell transistors.

Figure 4:
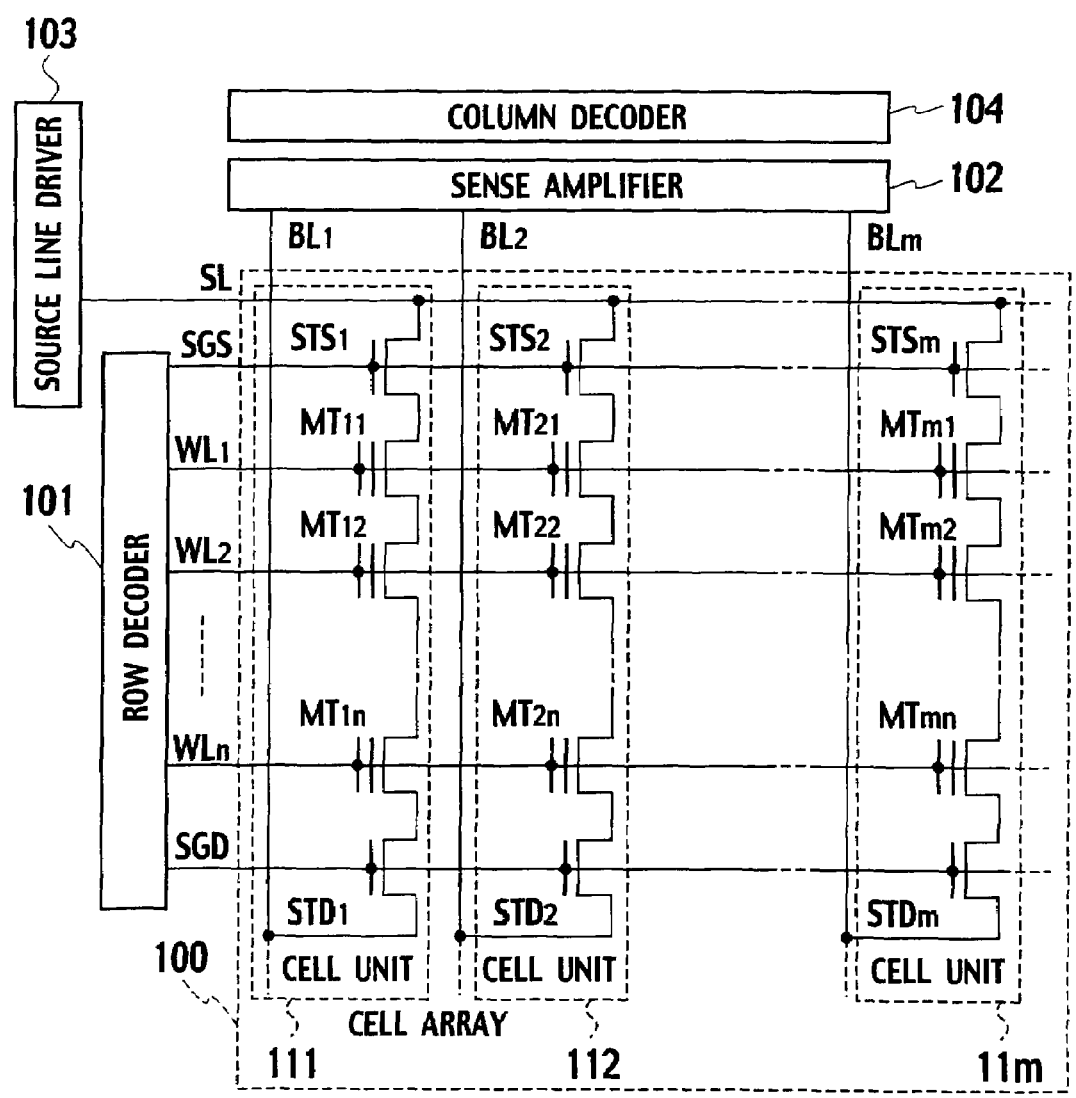
FIG. 4 is an equivalent circuit diagram showing an example of the cell array of the non-volatile semiconductor memory according to the embodiment of the present invention.

An equivalent circuit of the non-volatile semiconductor memory according to the embodiment shown in FIGS. 1 to 3 is shown in FIG. 4. As shown in FIG. 4, a cell array 100 comprises memory cell transistors $MT_{11}$ to $MT_{1n}$, $MT_{21}$ to $MT_{2n}$, ..., $MT_{m1}$ to $MT_{mn}$. In cell array 100, the memory cell transistors $MT_{11}$ to $MT_{1n}$, and the select gate transistors $STS_1$ and $STD_1$ are connected in series, thereby comprising a cell unit (linear arrangement) 111. The select gate transistors $STS_2$ to $STS_m$, the memory cell transistors $MT_{21}$ to $MT_{2n}$, ..., $MT_{m1}$ to $MT_{mn}$, and the select gate transistors $STD_2$ to $STD_m$ are connected in series, thereby comprising cell units (linear arrangements) 112, ..., 11m. The cell units 111, 112, ..., 11m are respectively arranged in turn in the row direction, thereby forming a matrix.

The drain region $42_1$ of the enhancement mode select gate transistor $STS_1$ is connected to the source region $42_1$ of the memory cell transistor $MT_{11}$ positioned at one end of the linear arrangement in which the group of memory cell transistors $MT_{11}$ to $MT_{1n}$ are connected in series. The select gate transistor $STS_1$ selects the memory cell transistors $MT_{11}$ to $MT_{1n}$. On the other hand, the source region $42(n+1)$ of the enhancement mode select gate transistor $STD_1$ is connected to the drain region $42(n+1)$ of the memory cell transistor $MT_{1n}$ positioned at the other end of the linear arrangement in which the group of memory cell transistors $MT_{11}$ to $MT_{1n}$ are connected in series. The select gate transistor $STD_1$ selects the memory cell transistors $MT_{11}$ to $MT_{1n}$. Components of the cell units $112, \ldots, 11m$ are the same as the cell unit $111$.

The source regions of the respective select gate transistors $STS_1$ to $STS_m$ are connected with a source line SL common to the source regions. A source line driver $103$, which supplies voltage to the source line SL, is connected to the source line SL. The following elements are connected to a row decoder $101$: a select gate line SGS common to the select gate transistors $STS_1$ to $STS_m$; a select gate line SGD common to the select gate transistors $STD_1$ to $STD_m$; a word line $WL_1$ common to the memory cell transistors $MT_{11}, MT_{21}, \ldots, MT_{m1}$; a word line $WL_2$ common the memory cell transistors $MT_{12}, MT_{22}, \ldots, MT_{m2}; \ldots$; and a word line $WL_n$ common to the memory cell transistors $MT_{1n}, MT_{2n}, \ldots, MT_{mn}$. The row decoder $101$ obtains a row address decoded signal by decoding a row address signal, and supplies operation voltage to the word lines $WL_1$ to $WL_m$ and the select gate lines SGS and SGD, in a selective manner. Each of the bit lines $BL_1$ to $BL_m$ is connected to the drain region of each of the select gate transistors $STD_1$ to $STD_m$. A sense amplifier $102$ and a column decoder $104$ are connected to the bit lines $BL_1$ to $BL_m$. The column decoder $104$ obtains a column address decoded signal by decoding a column address signal, and selects one out of the bit lines $BL_1$ to $BL_m$ based on the column address decoded signal. The sense amplifier $102$ amplifies memory signals, which have been read from a memory cell transistor selected by the row decoder $101$ and the column decoder $104$.

Next, a description will be provided for operations of writing, erasing and reading performed by the non-volatile semiconductor memory according to the embodiment of the present invention. In an initial state (data is 1) where the memory cell transistor $MT_{11}$ shown in FIG. 1 has not accumulated electrons in its floating gate electrode $13$, a threshold voltage of the memory cell transistor $MT_{11}$ is a negative threshold voltage $V_e$ as shown in FIG. 5, since the memory cell transistor $MT_{11}$ is a depletion mode memory cell transistor.

Figure 7:
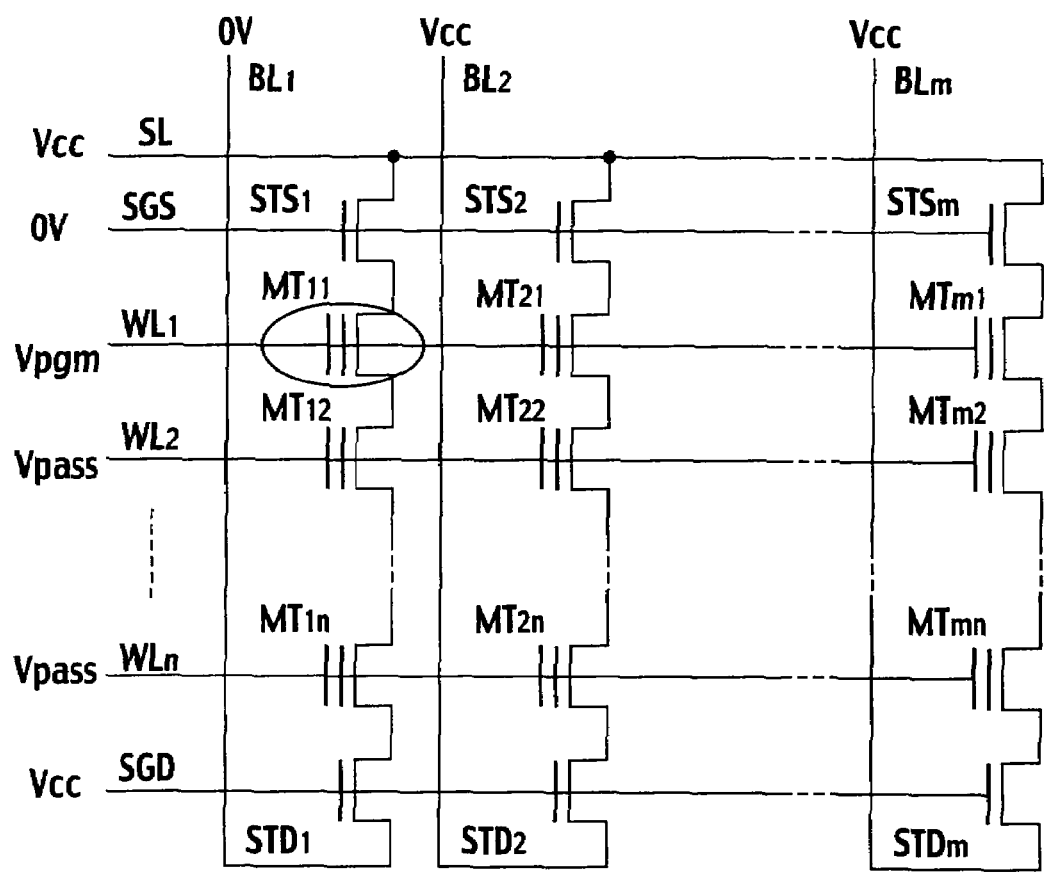
FIG. 7 is an equivalent circuit diagram for explaining a writing operation of the non-volatile semiconductor memory according to the embodiment of the present invention.

To begin with, a description will be provided for an example of a writing operation with reference to FIGS. 6 and 7. Hereinafter, it is assumed that the memory cell transistor $MT_{11}$ is selected during its writing and reading operations. The memory cell transistor $MT_{11}$ which has been selected is referred to as a "selected memory cell transistor," and the memory cell transistors $MT_{12}$ to $MT_{1n}$, $MT_{21}$ to $MT_{2n}, \ldots$, and $MT_{m1}$ to $MT_{mn}$ which have not been selected are referred to as "non-selected memory cell transistors." The bit line $BL_1$ and the word line $WL_1$ connected to the selected memory cell transistor $MT_{11}$ are referred to as a "selected bit line" and a "selected word line" respectively. The bit lines $BL_2$ to $BL_m$ and the word lines $WL_2$ to $WL_n$ connected only to the non-selected memory cell transistors $MT_{21}$ to $MT_{2n}, \ldots, MT_{m1}$ to $MT_{mn}$ and $MT_{mn}$ are referred to as "non-selected bit lines" and "non-selected word lines."

A voltage of 0 V and a power supply voltage $V_{cc}$ (for example, 3 V) are applied to the selected bit line $BL_1$ and the source line SL, respectively. A voltage of 0 V is applied to the select gate line SGS, thus causing the select gate transistor $STS_1$ to be in the "off" state, thus causing the source line SL to be in the "cut-off" state. The power supply voltage $V_{cc}$ (for example, 3 V) is applied to the select gate line SGD, and the select gate transistor $STD_1$ is caused to be in the "on" state, accordingly causing 0 V in the selected bit line $BL_1$ to be transmitted to the selected memory cell transistor $MT_{1n}$.

A write voltage $V_{pgm}$ (for example, 20 V) is applied to the selected word line $WL_1$. An intermediate potential $V_{pass}$ (for example, 10 V) is applied to each of the non-selected word lines $WL_2$ to $WL_m$. The selected memory cell transistor $MT_{11}$ and the non-selected memory cell transistors $MT_{12}$ to $MT_{1n}$ are all caused to be in the "on" state, thus causing 0 V in the selected bit line $BL_1$ to be transmitted.

In the selected memory cell transistor $MT_{11}$, the write voltage $V_{pgm}$ (for example, 20 V) is applied to the control gate electrode $15$ shown in FIG. 1, and a strong electric field is applied between the channel region $411$ underneath the floating gate electrode $13$ to which 0 V is transmitted from the selected bit line $BL_1$ and the floating gate electrode $13$, thus injecting electrons into the floating gate electrode $13$ through the gate insulating film $12$. Once electrons have been accumulated in floating gate electrode $13$, a threshold voltage of the selected memory cell transistor $MT_{11}$ increases by $\Delta V$ from the negative threshold voltage Ve to a positive threshold voltage Vp, as shown in FIG. 5. Accordingly, the selected memory cell transistor $MT_{11}$ is in the "write" state (data is 0).

For example, the power supply voltage $V_{cc}$ (for instance, 3 V) is applied to each of the non-selected bit lines $BL_2$ to $BL_m$. A voltage of 0 V is applied to the select gate line SGS, and thus each of the select gate transistors $STS_2$ to $STS_m$ is in the "off" state, accordingly causing the source line SL to be in the "cut-off" state. The power supply voltage $V_{cc}$ (for example, 3 V) is applied to the select gate line SGD, thus causing each of the selected gate transistors $STD_2$ to $STD_m$ to be in the "on" state. Accordingly, voltages (for example, $3\ V - V_{th}\ [V]$), which are obtained by subtracting the threshold voltage $V_{th}$ in the select gate transistors $STD_2$ to $STD_m$ from the power supply voltages $V_{cc}$ in the non-selected bit lines $BL_2$ to $BL_m$ respectively, to be transmitted to the non-selected memory cell transistors $MT_{21}$ to $MT_{2n}, \ldots, MT_{m1}$ to $MT_{mn}$. Since the select gate line SGS is in the "cut-off" state, electric potential differences between each of the select gate transistors $STD_2$ to $STD_m$ and each of the source regions of the respective non-selected memory cell transistors, to which the aforementioned voltages are transmitted, are caused to be $V_{cc} - (V_{cc} - V_{th}) = V_{th}\ [V]$. Consequently, the select gate transistors $STD_2$ to $STD_m$ are also in the "cut-off" state.

When the select gate transistors $STD_2$ to $STD_m$ and the select gate transistors $STS_2$ to $STS_m$ are cut off, the channel regions underneath the respective non-selected memory cell transistors $MT_{21}$ to $MT_{2n}, \ldots, MT_{m1}$ to $MT_{mn}$ are in the "on" state, and the channel regions from the source line SL and the bit lines $BL_2$ to $BL_m$ are in the "floating" state. Potentials of channel regions which have been in the "floating" state are increased (larger than, or equal to, $V_{cc}$ and smaller than, or equal to, $V_{pass}$, for example, 7 to 8 V) by the coupling of the potentials $V_{pgm}$ and $V_{pass}$.

Since channel potentials of the non-selected memory cell transistors $MT_{21}$ to $MT_{2n}, \ldots, MT_{m1}$ to $MT_{mn}$ are increased, even if the write voltage $V_{pgm}$ (for example, 20 V) is applied to control gate electrodes $15$ of the non-selected memory cell transistors $MT_{21}$ to $MT_{2n}, \ldots, MT_{m1}$ to $MT_{mn}$, differences in potential between each of the non-selected memory cell transistors $MT_{21}$ to $MT_{m1}$ and each of the corresponding floating gate electrodes $13$ are small. Accordingly, electrons are not injected into the floating gate electrodes $13$.

Figure 8:
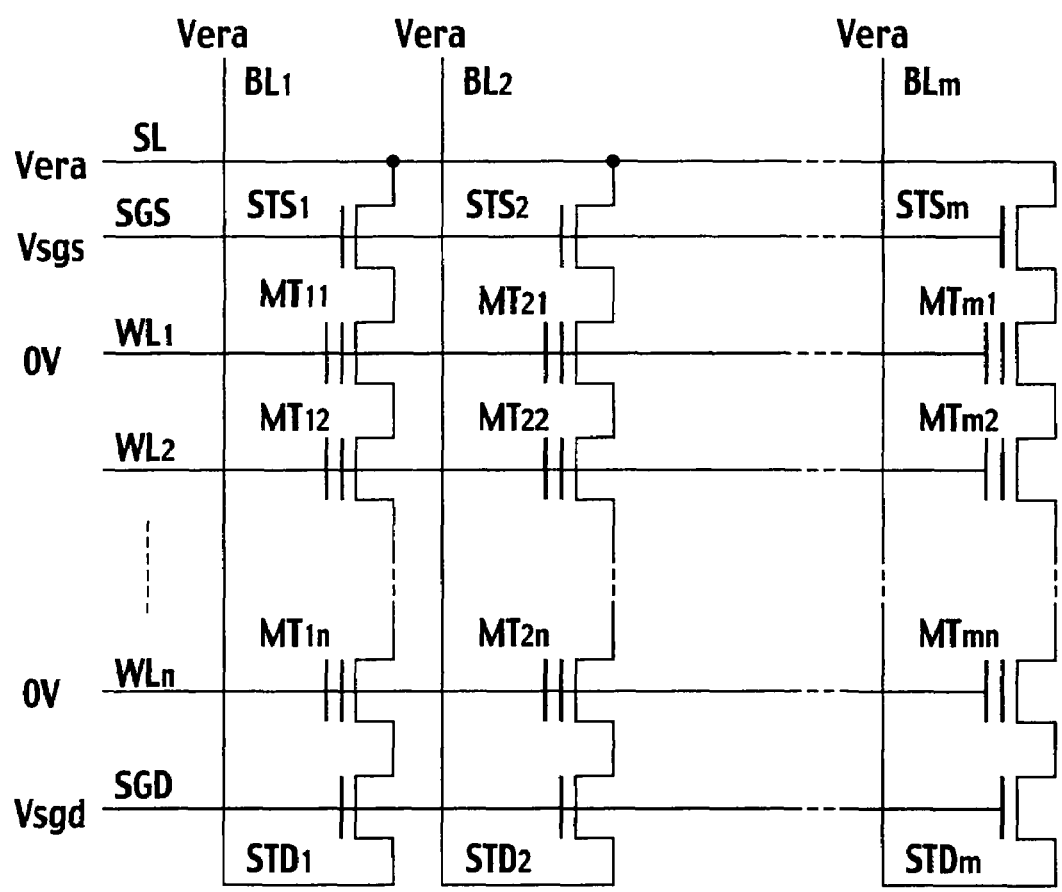
FIG. 8 is an equivalent circuit diagram for explaining an erasing operation of the non-volatile semiconductor memory according to the embodiment of the present invention.

Next, a description will be provided for an example of the erasing operation with reference to FIGS. 6 and 8. In the NAND flash EEPROM, data can be erased simultaneously from all the memory cell transistors in a selected block. Here, a description will be provided for an example of a simultaneous erasure of all the written data from the memory cell transistors $MT_{11}$ to $MT_{1n}, MT_{21}$ to $MT_{2n}, \ldots, MT_{m1}$ to $MT_{mn}$ in the cell array $100$.

An erase voltage $V_{era}$ (for example, 20 V) is applied to all the bit lines $BL_1$ to $BL_m$ and the source line SL, respectively.

An initial voltage $V_{sgd}$ (for example, 4 V) is applied to the select gate line SGD, so that the select gate transistor $STD_1$ is in the "on" state. Accordingly, the erase voltage $V_{era}$ (for example, 20 V) in the bit line $BL_1$ to $BL_m$ is transmitted to the memory cell transistors $MT_{1n}$, $MT_{2n}$, ..., $MT_{mn}$. An initial voltage $V_{sgs}$ (for example, 4 V) is applied to the select gate line SGS, so that the select gate transistor $STS_1$ is in an "on" state. Accordingly, the erase voltage $V_{era}$ (for example, 20 V) in the source line SL is transmitted to the memory cell transistors $MT_{11}$, $MT_{21}$, ..., $MT_{m1}$.

A voltage of 0 V is applied to all the word lines $WL_1$ to $WL_n$. Since the memory cell transistors $MT_{11}$ to $MT_{1n}$, $MT_{21}$ to $MT_{2n}$, ..., $MT_{m1}$ to $MT_{mn}$ are depletion mode and normally-on transistors, the memory cell transistors $MT_{11}$ to $MT_{1n}$, $MT_{21}$ to $MT_{2n}$, ..., $MT_{m1}$ to $MT_{mn}$ are in the "on" state if 0 V is applied to the control gate electrodes 15. When the erase voltage $V_{era}$ (for example, 20 V) is applied to the third semiconductor layer 3, electrons are emitted from the floating gate electrodes 13 to the channel regions through the gate insulating film 12. Once the electrons are emitted from the floating gate electrodes 13, the threshold voltage of the selected memory cell transistor $MT_{11}$ is decreased by $\Delta V$ from a positive threshold voltage $V_p$ to a negative threshold voltage $V_e$, as shown in FIG. 5. Thus, the selected memory cell transistor $MT_{11}$ will be in the "erase" state (date is 1). Consequently, data are erased simultaneously from the memory cell transistors $MT_{11}$ to $MT_{1n}$, $MT_{21}$ to $MT_{2n}$, ..., $MT_{m1}$ to $MT_{mn}$.

Figure 9:
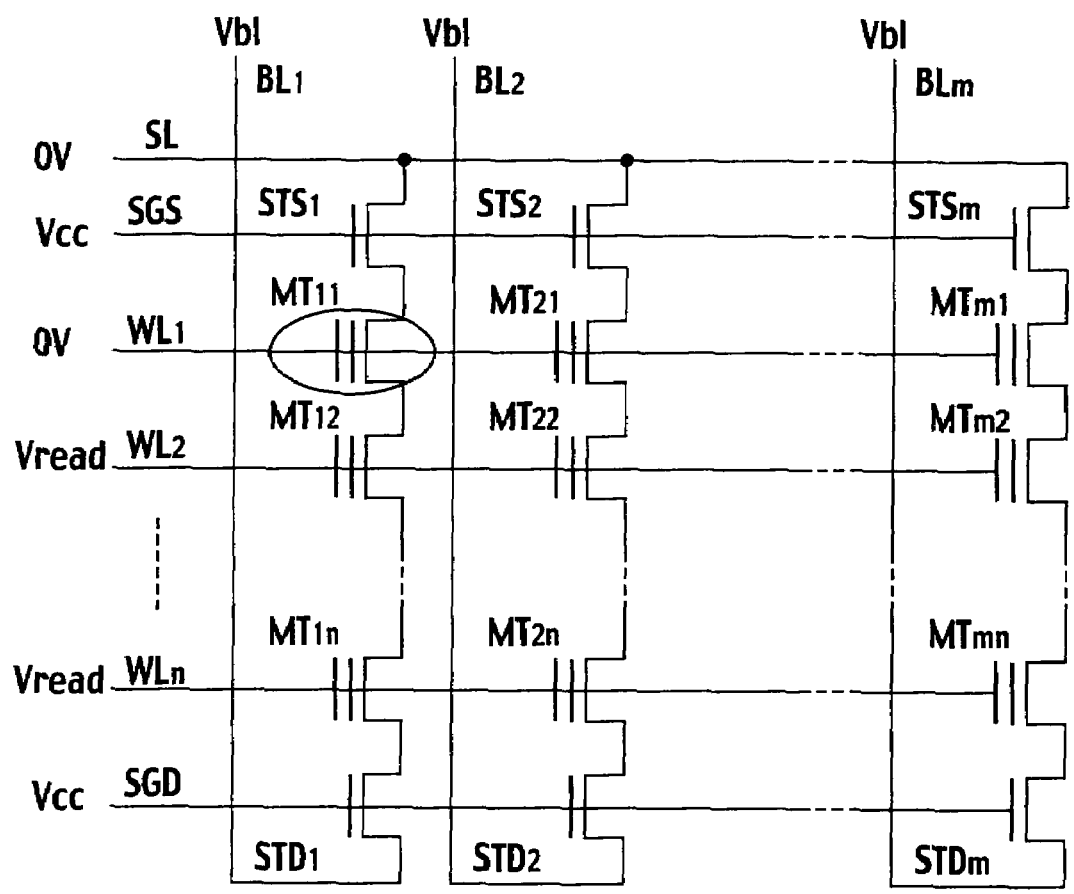
FIG. 9 is an equivalent circuit diagram for explaining reading operation of the non-volatile semiconductor memory according to the embodiment of the present invention.

Next, a description will be provided for an example of a reading operation with reference to FIGS. 6 and 9. A pre-charged voltage $V_{b1}$ (for example, 1 V) is applied to each of the bit lines $BL_1$ to $BL_m$, and 0 V is applied to the source line SL. The power supply voltage $V_{cc}$ (for example, 3 V) is applied to the select gate line SGS, so that the select gate transistor $STS_1$ is in the "on" state. Accordingly, 0 V in the source line SL is transmitted to the memory cell transistors $MT_{11}$, $MT_{21}$, ..., $MT_{m1}$. The power supply voltage $V_{cc}$ (for example, 3 V) is applied to the select gate line SGD, so that the select gate transistor $STD_1$ is in the "on" state. Accordingly, the pre-charged voltage $V_{b1}$ (for example, 1 V) in the bit lines $BL_1$ to $BL_m$ is transmitted to the memory cell transistors $MT_{1n}$, $MT_{2n}$, ..., $MT_{mn}$.

Figure 10:
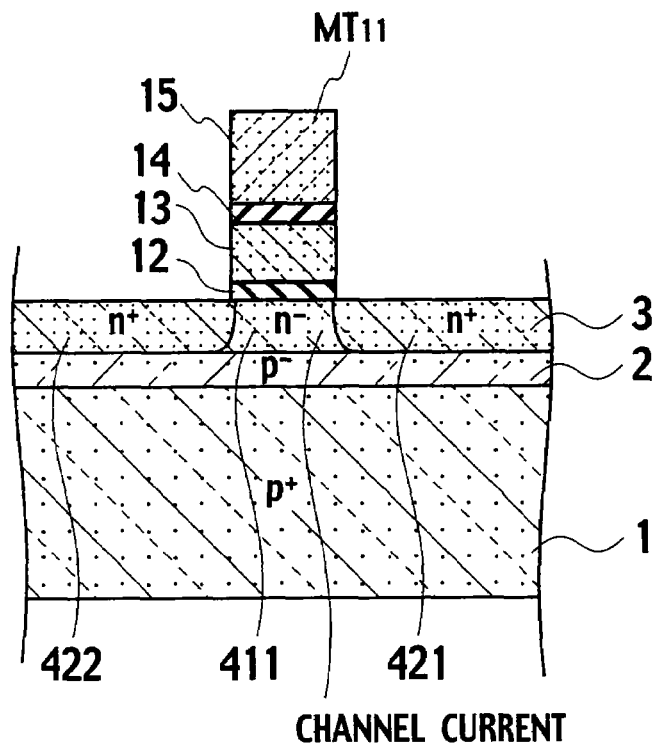
FIG. 10 is a cross-sectional view for explaining a floating gate electrode, which does not store electrons of the memory cell transistor of the non-volatile semiconductor memory according to the embodiment of the present invention.
Figure 11:
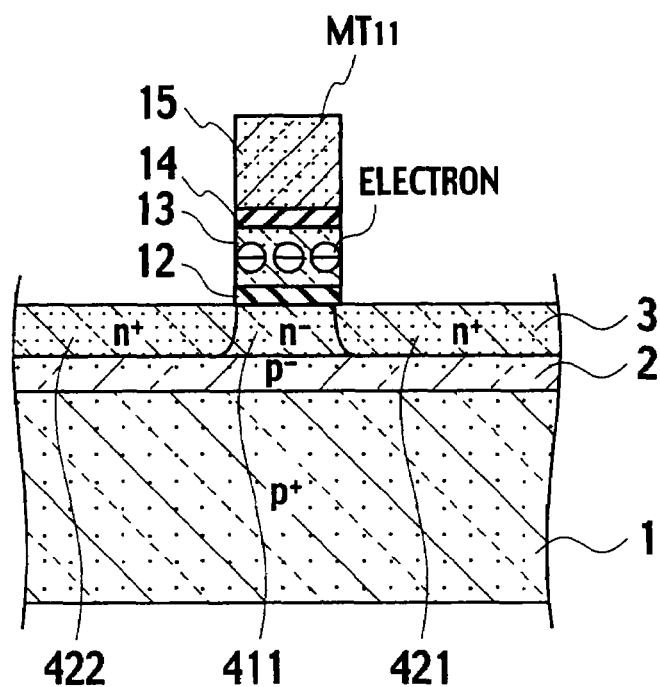
FIG. 11 is a cross-sectional view for explaining how the floating gate electrode stores electrons of the memory cell transistor of the non-volatile semiconductor memory according to the embodiment of the present invention.

A voltage $V_{read}$ (for example, 4.5 V), which is higher than the power supply voltage $V_{cc}$, is applied to the non-selected word lines $WL_2$ to $WL_m$, so that the non-selected memory cell transistors $MT_{12}$ to $MT_{1n}$, $MT_{22}$ to $MT_{2n}$, $MT_{m2}$ to $MT_{mn}$ are in the "on" state. Accordingly, the non-selected memory cell transistors $MT_{12}$ to $MT_{1n}$, $MT_{22}$ to $MT_{2n}$, $MT_{m2}$ to $MT_{mn}$ serve as transfer transistors. A voltage of 0 V is applied to the selected word line $WL_1$. In the memory cell transistor $MT_{11}$, 0 V is applied to the control gate electrode 15 as shown in FIGS. 10 and 11. In a case where electrons have not been accumulated in the floating gate electrode 13 as shown in FIG. 10, the threshold voltage $V_e$ of the selected memory cell transistor $MT_{11}$ is less than 0 V as shown in FIG. 5. For this reason, even if the voltage applied to the control gate electrode 15 is 0 V, the selected memory cell transistor $MT_{11}$ is in the "on" state, and accordingly channel current flows.

On the other hand, when electrons have accumulated in the floating gate electrode 13 as shown in FIG. 11, the threshold voltage $V_p$ of the selected memory cell transistor $MT_{11}$ is higher than 0 V, as shown in FIG. 5. A depletion layer A of the channel region 411 underneath the floating gate electrode 13 increases, as shown in FIG. 11. Accordingly, the memory cell transistor $MT_{11}$ is in the "off" state. Thus, the channel current does not flow. If the channel current flows into the selected memory cell transistor $MT_{11}$, it is determined that the selected memory cell transistor $MT_{11}$ is in the "erase" state (data is "1"). If the channel current does not flow into the selected memory cell transistor $MT_{11}$, it is determined that the selected memory cell transistor $MT_{11}$ is in the "write" state (data is "0").

Note that, the enhancement mode and normally-off memory cell transistors $MT_{11}$ to $MT_{1n}$ having n-type channel regions, which are completely depleted at thermal equilibrium state, can be operated similar to depletion mode memory cell transistors, since these transistors turn on by forming accumulation layers of electric charge when a bias voltage is applied.

Figure 38:
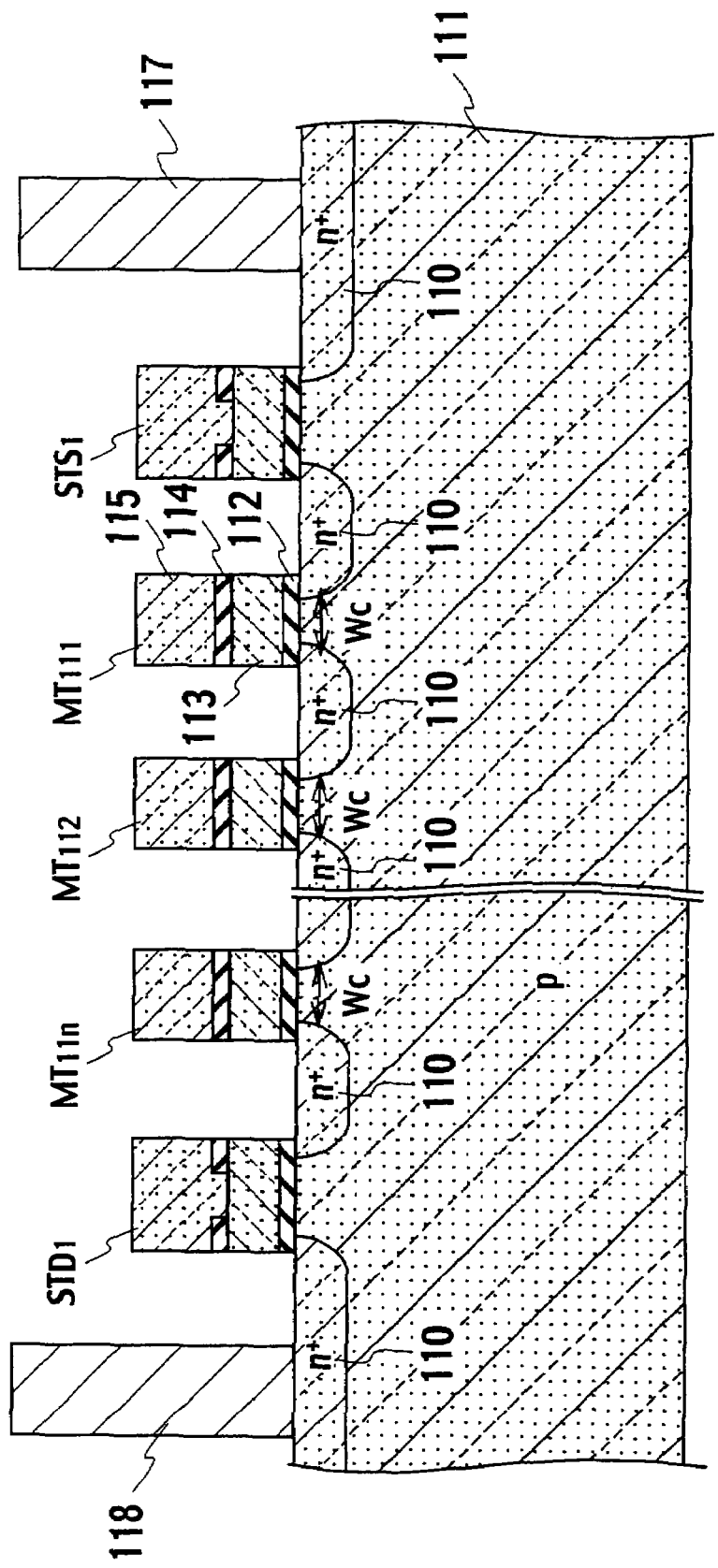
FIG. 38 is a cross-sectional view in the column direction showing an example of a cell array of a non-volatile semiconductor memory as a comparative example.

FIG. 38 shows enhancement and inversion channel mode memory cell transistors $MT_{111}$ to $MT_{11n}$ as a comparative example. Each of the memory cell transistors $MT_{111}$ to $MT_{11n}$ includes $n^+$-type source and drain regions 110 which are provided on upper parts of a p-type semiconductor substrate 111, and a floating gate electrode 113 and a control gate electrode 115, which are provided above a channel region between the source and drain regions 110. As each of the memory cell transistors $MT_{111}$ to $MT_{11n}$ as the enhancement and inversion channel mode transistor has been minaturized, the width $W_c$ of the channel region between the source and drain regions 110 has become so narrow that the influence of the short channel effect has increased. On the other hand, since the memory cell transistors $MT_{11}$ to $MT_{1n}$, shown in FIG. 1, includes the source and drain regions 421 to 42(n+1) and the channel regions 411 to 41n, which are of same conductivity type, it is possible to decrease an influence of the short channel effect.

Furthermore, as the consentration of memory cells in the non-volatile semiconductor memory has been increased, when high bias is applied to a cell in writing operations, an electrical field, which is applied to the channel regions increase, and breakdown occurs in some cases. By contrast, according to the embodiment of the present invention, the second semiconductor layer 2, which has a lower concentration of impurities than that of the first semiconductor layer 1, is interposed between the third semiconductor layer 3, which includes the source and drain regions 421 to 42(n+1) and the channel regions 411 to 41n, and the first semiconductor layer (semiconductor substrate) 1. Thereby, it is possible to improve breakdown voltage by mitigating an electrical field in a junction part of the first, second and third semiconductor layers 1, 2 and 3, even if a reverse bias is applied.

In addition, in a case where electrons have accumulated in the floating gate electrode 13 of the selected memory cell transistor $MT_{11}$, as shown in FIG. 11, when 0 V is applied to the control gate electrode 15 during a reading operation, the channel region 411 is depleted. Thus, the selected memory cell transistor $MT_{11}$ is fully in the "off" state.

In the NAND flash EEPROM including the source and drain regions 421 to 42(n+1) and the channel regions 411 to 41n, each having the same conductivity types, the same as a general NAND flach EEPROM including the channel regions having a conductivity type different from that of the source and drain regions, it is possible to operate the flach EEPROM by applying voltages having the same polarization in writing operation, erasing operation or reading operation, as shown in FIG. 5.

A voltage of the same polarity is applied during operations of writing, erasing and reading as shown in FIG. 5. Thereby, the writing, erasing and reading operations can be performed in common with a NAND flash EEPROM in which the SOI technology has not been adopted. Consequently, timing adjustment is easier, and the area of the peripheral circuit portion can be decreased, in comparison with a case where operation voltages of two polarities, positive and negative, are applied.

Moreover, it is easy to cut off the source line SL and the bit line $BL_1$, since the select gate transistors $STS_1$ and $STD_1$, shown in FIG. 1, connected in series in the column direction with the memory cell transistors $MT_{11}$ to $MT_{1n}$ are enhancement transistors.

Figure 39:
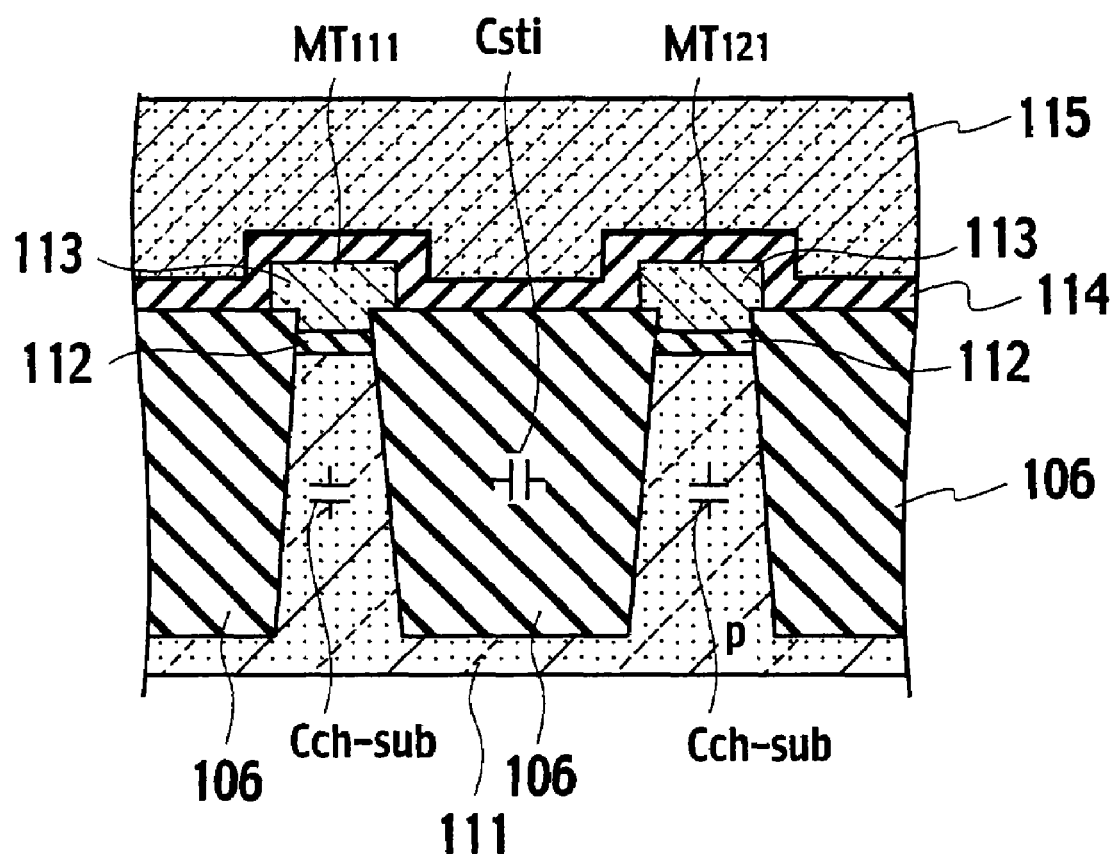
FIG. 39 is a cross-sectional view in the row direction showing an example of the cell array of a non-volatile semiconductor memory as the comparative example.

In addition, the memory cell transistors $MT_{111}$ and $MT_{121}$ of the comparative case are isolated from one another in the row direction by element isolation regions (STI) 106, respectively, as shown in FIG. 39, and a parasitic capacitance $C_{sti}$ is generated between the element isolation regions (STI) 106. On the other hand, the memory cell transistors $MT_{11}$ and $MT_{21}$ in the row direction are completely isolated from each other by the element isolation insulating film 6 as shown in FIG. 3. Consequently, parasitic capacitance $C_{sti}$ influence between the element isolation regions (STI) 106, shown in FIG. 39, can be decreased. Accordingly, punch-through immunity, field inversion breakdown voltage and the like do not have to be considered. For this reason, the widths $W_s$ of the respective element isolation insulating films 6 in the row direction shown in FIG. 3 can be set at a minimum width for allowing lithographic and etching techniques.

The peripheral circuits (MOS transistors), which are not illustrated, for driving the memory cell transistors $MT_{11}$ to $MT_{1n}$, $MT_{21}$ to $MT_{2n}$, ..., $MT_{m1}$ to $MT_{mn}$ can also be formed on the second semiconductor layer 2 provided in the first semiconductor layer 1. With regard to an n channel MOS transistor used for a CMOS circuit, p-type impurity diffusion layers may be used, in common with the select gate transistor. With regard to a p channel MOS transistor used for the CMOS circuit, n-type impurity diffusion layers may be used.

Next, a description will be provided for an example of a method for manufacturing the non-volatile semiconductor memory according to the present embodiment. Here, FIGS. 12A, 13A, ..., and 26A show a cross-sectional process flow of the cell array, shown in FIG. 2, in the column direction taken along the I-I line. In addition, FIGS. 12B, 13B, ..., and 26B show a cross-sectional process flow of the cell array, in the row direction, taken along the II-II line.

Note that the method for manufacturing the non-volatile semiconductor memory shown in FIG. 12A to FIG. 26B is an example. It is possible to provide the non-volatile semiconductor memory by other various methods.

Figure 12A:
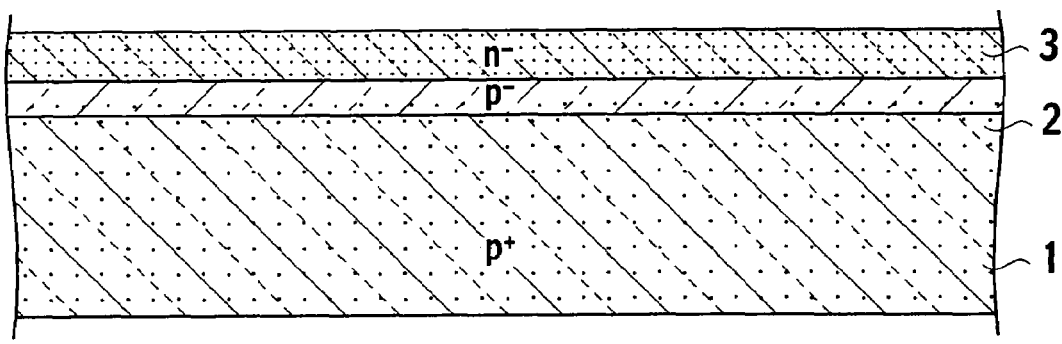
FIG. 12A is a cross-sectional view in the column direction (I-I direction of FIG. 2) showing an example of a method for manufacturing the non-volatile semiconductor memory according to the embodiment of the present invention.
Figure 12B:
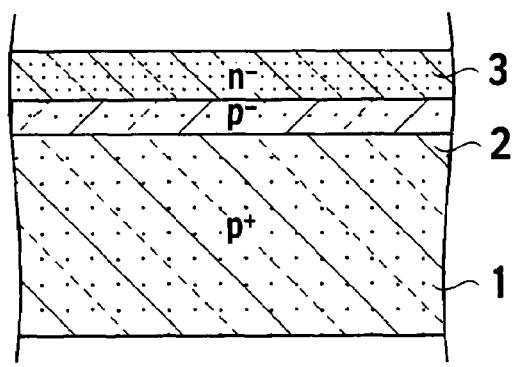
FIG. 12B is a cross-sectional view in the row direction (II-II direction of FIG. 2) showing the example of the method for manufacturing the non-volatile semiconductor memory according to the embodiment of the present invention.

As shown in FIGS. 12A and 12B, a first semiconductor layer (semiconductor substrate) 1 having p-type conductivity is provided. A second semiconductor layer 2 is formed by growing an epitaxial layer, which has p-type conductivity with an impurity concentration lower than the p-type impurity consentration of the first semiconductor layer 1, on the first semiconductor layer 1. The second semiconductor layer 2 may also be formed by the epitaxial layer with ion implantation of p-type impurities like boron ($^{11}B^+$) and subsequent thermal processing, after growing a non-doped epitaxial layer on the first semiconductor layer 1.

Then, a third semiconductor layer 3 is formed by growing an epitaxial layer having n-type conductivity on the second semiconductor layer 2. Perhaps, after growing an epitaxial layer on the second semiconductor layer 2 without doping, n-type impurity ions, such as phosphorous ($^{31}P^+$), arsenic ($^{75}As^+$) or the like, may be implanted to the epitaxial layer and subjected to a subsequent thermal treatment. Note that, after growing the n-type epitaxial layer on the first semiconductor layer 1, the second semiconductor layer 2 and the third semiconductor layer 3 may be formed by ion implantation of p-type impurities to a lower part of the n-type epitaxial layer and then performing a thermal process.

Figure 13A:
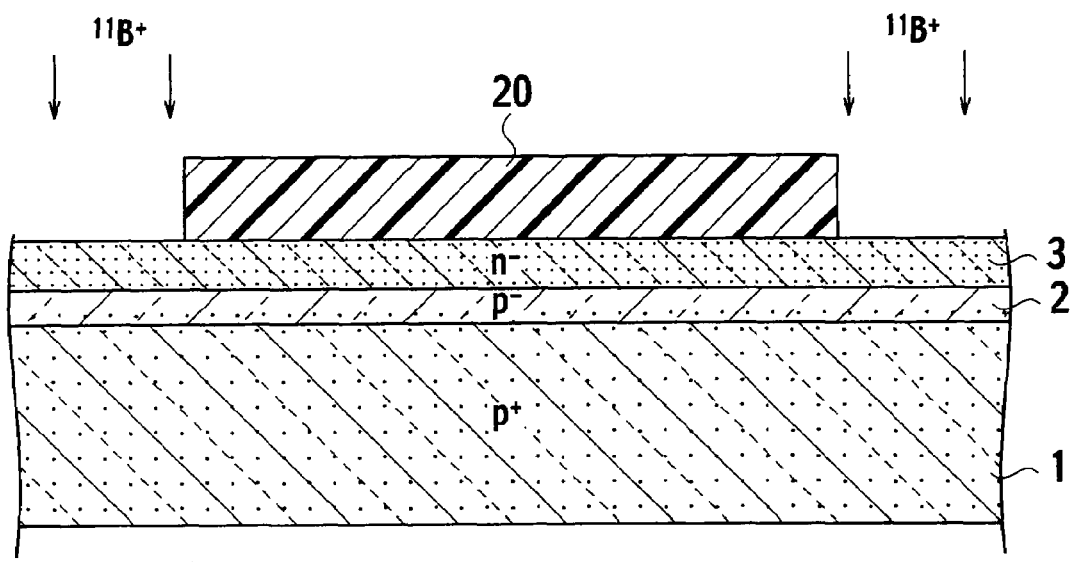
FIG. 13A is a cross-sectional view in the column direction after the process of FIG. 12A showing the method for manufacturing the non-volatile semiconductor memory according to the embodiment of the present invention.
Figure 13B:
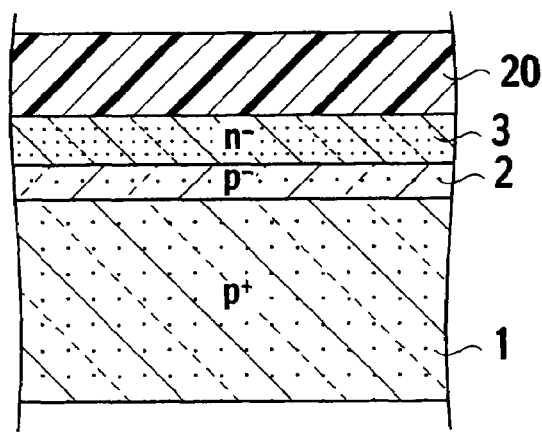
FIG. 13B is a cross-sectional view in the row direction after the process of FIG. 12B showing the method for manufacturing the non-volatile semiconductor memory according to the embodiment of the present invention.

A resist film is coated on the third semiconductor layer 3. The resist film is patterned by a lithographic technique. As shown in FIGS. 13A and 13B, ions having a p-type impurity, such as $^{11}B^+$, are implanted with the patterned resist film 20 used as a mask. Residual resist film 20 is removed by use of a resist remover or the like. When deemed necessary, a resist film is also coated on the region surrounding the cell array, where the peripheral circuit is to be formed, and the coated resist film is patterned. Then, if necessary, ions are implanted.

Figure 14A:
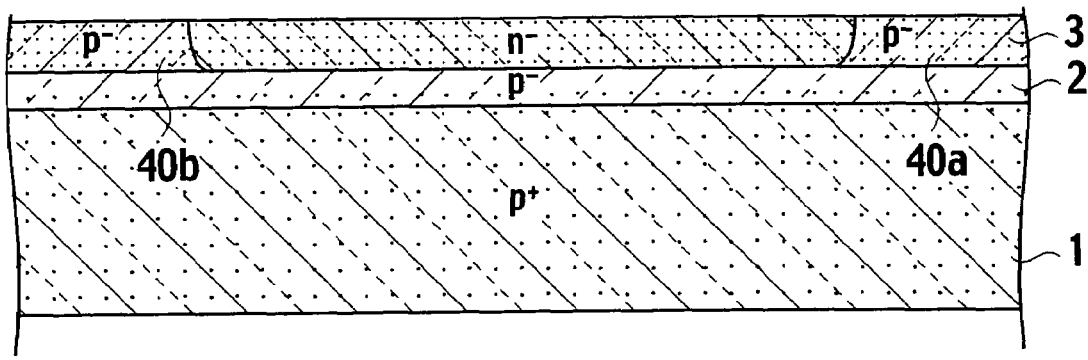
FIG. 14A is a cross-sectional view in the column direction after the process of FIG. 13A showing the method for manufacturing the non-volatile semiconductor memory according to the embodiment of the present invention.
Figure 14B:
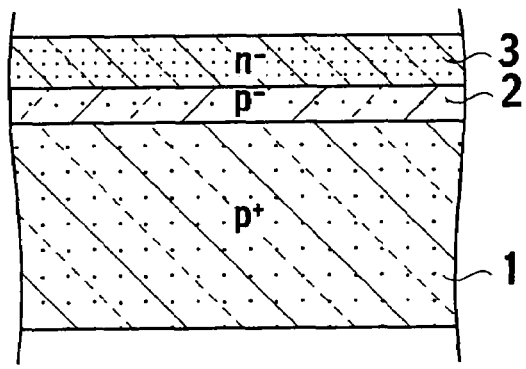
FIG. 14B is a cross-sectional view in the row direction after the process of FIG. 13B showing the method for manufacturing the non-volatile semiconductor memory according to the embodiment of the present invention.

Then, as shown in FIGS. 14A and 14B, impurity ions implanted in the third semiconductor layer 3 are activated by thermal treatment. As a result, $p^-$ type impurity diffusion layers 40a and 40b are formed in regions which will form select gated transistors.

Figure 15A:
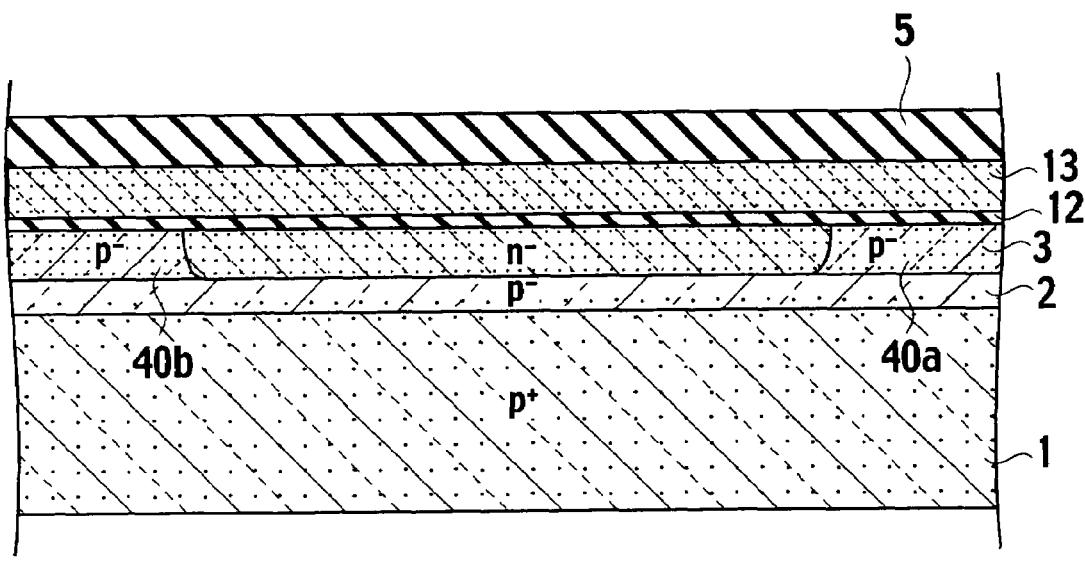
FIG. 15A is a cross-sectional view in the column direction after the process of FIG. 14A showing the method for manufacturing the non-volatile semiconductor memory according to the embodiment of the present invention.
Figure 15B:
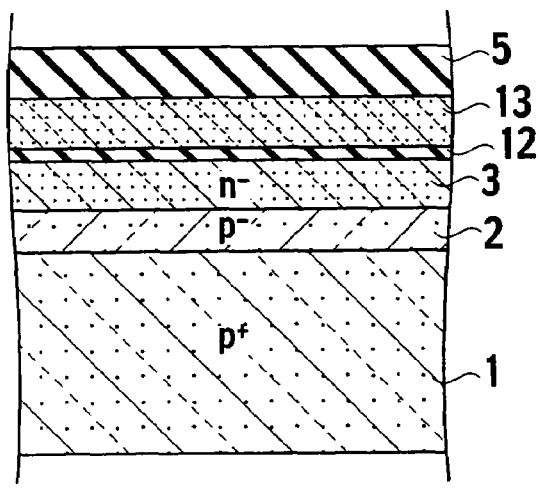
FIG. 15B is a cross-sectional view in the row direction after the process of FIG. 14B showing the method for manufacturing the non-volatile semiconductor memory according to the embodiment of the present invention.

Next, as shown in FIGS. 15A and 15B, a gate insulating film (tunnel oxidation film) 12, such as a $SiO_2$ film, is formed by a thermal oxidation method so that the thickness of the gate insulating film is approximately 1 nm to 15 nm. A P-doped first polysilicon layer (first conductive layer) 13, which will be a floating gate electrode, is deposited on the gate insulating film 12 by reduced pressurized CVD (RPCVD) so that the thickness of the first polysilicon layer may be about 10 nm to about 200 nm. Subsequently, a mask material 5, such as a $Si_3N_4$ film, is deposited on the first polysilicon layer 13 by CVD so that the thickness of the mask material may be approximately 50 nm to 200 nm.

Figure 16A:
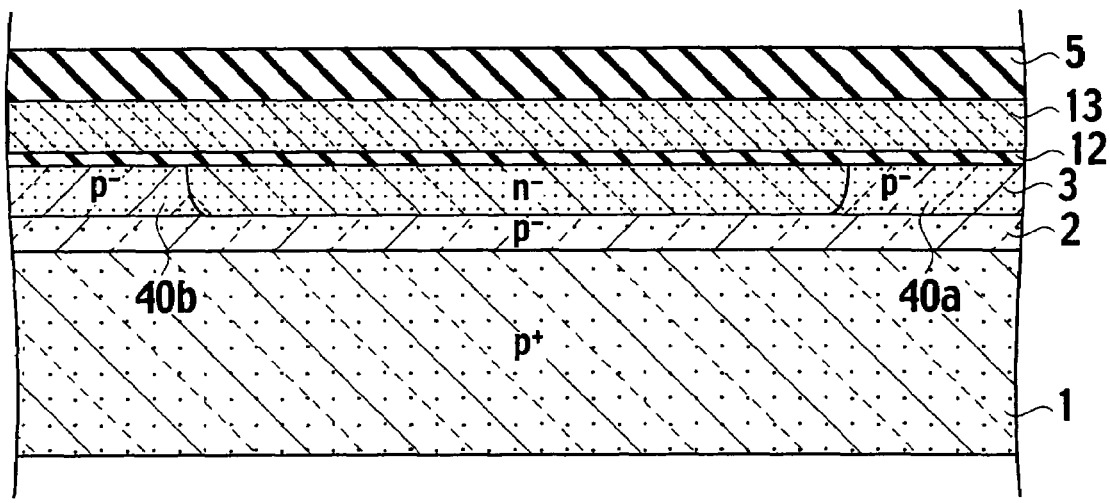
FIG. 16A is a cross-sectional view in the column direction after the process of FIG. 15A showing the method for manufacturing the non-volatile semiconductor memory according to the embodiment of the present invention.
Figure 16B:
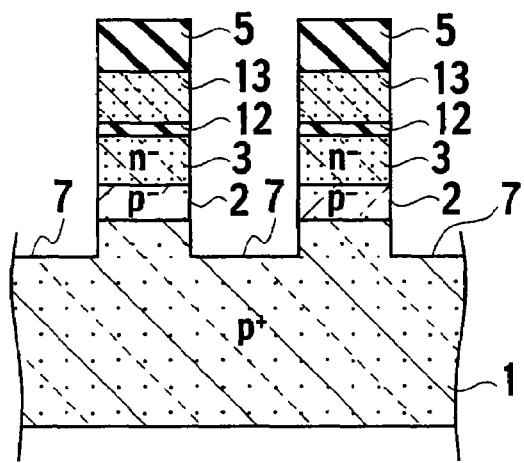
FIG. 16B is a cross-sectional view in the row direction after the process of FIG. 15B showing the method for manufacturing the non-volatile semiconductor memory according to the embodiment of the present invention.

A resist film is spin-coated on the mask material 5, and an etching mask of the resist film is formed by a lithographic technique. Parts of the mask material 5 are removed in a selective manner by reactive ion etching (RIE) in which an etching mask is used. After etching, the resist film is removed. With the mask material 5 used as an etching mask, parts of the first polysilicon layer 13, the gate insulating film 12, the third semiconductor layer 3 and the second semiconductor layer 2 are removed in the column direction in a selective manner. As a result, groove portions 7 are formed, which penetrate through the first polysilicon layer 13, the gate insulating film 12, the third semiconductor layer 3 and the second semiconductor layer 2, as shown in FIGS. 16A and 16B. Although FIG. 16B shows that parts of the first semiconductor layer 1 are removed, the surface of the first semiconductor layer 1 may retain planar. Furthermore, the groove portions 7 may not penetrate the second semiconductor layer 2, the second semiconductor layer 2 may retain on the first semiconductor layer 1 in a depth direction, and the surface of the second semiconductor layer 2 may retain planar.

Figure 17A:
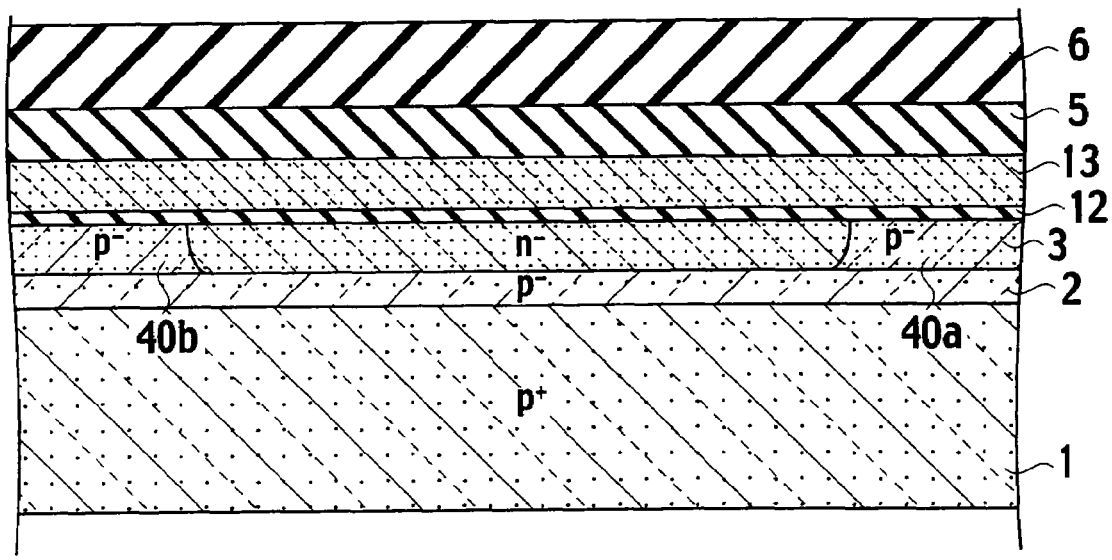
FIG. 17A is a cross-sectional view in the column direction after the process of FIG. 16A showing the method for manufacturing the non-volatile semiconductor memory according to the embodiment of the present invention.
Figure 17B:
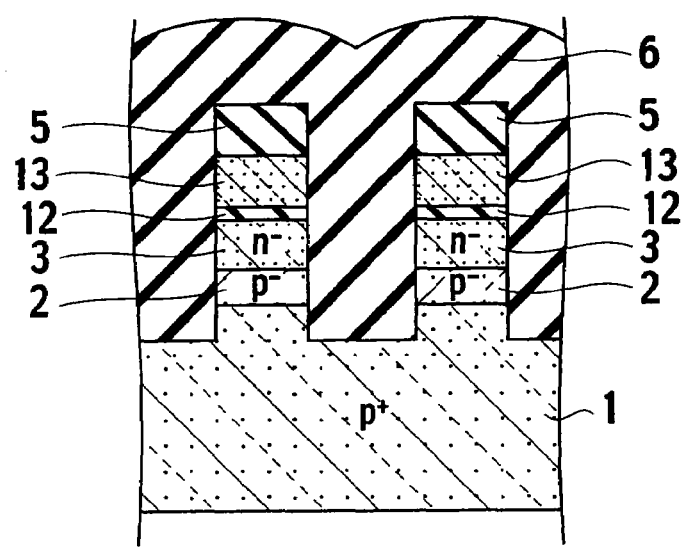
FIG. 17B is a cross-sectional view in the row direction after the process of FIG. 16B showing the method for manufacturing the non-volatile semiconductor memory according to the embodiment of the present invention.
Figure 18A:
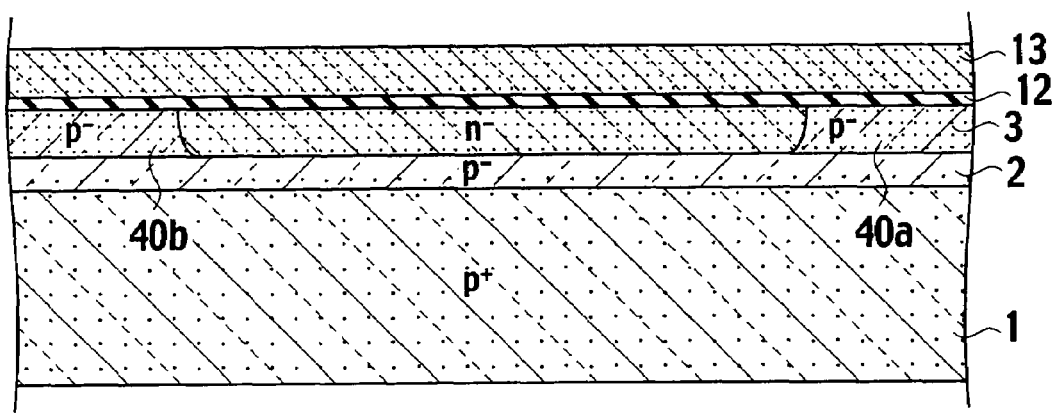
FIG. 18A is a cross-sectional view in the column direction after the process of FIG. 17A showing the method for manufacturing the non-volatile semiconductor memory according to the embodiment of the present invention.
Figure 18B:
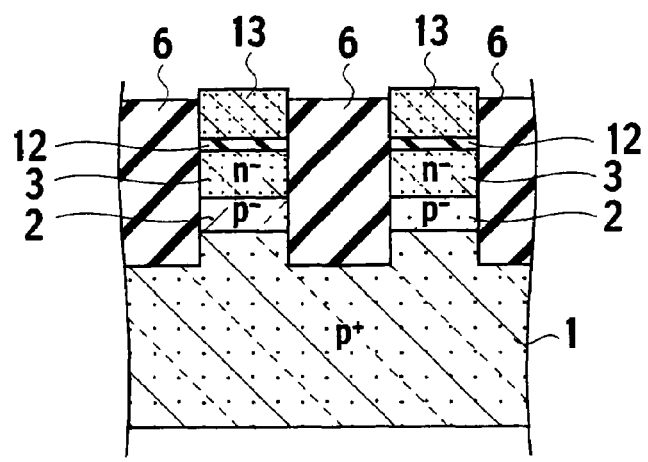
FIG. 18B is a cross-sectional view in the row direction after the process of FIG. 17B showing the method for manufacturing the non-volatile semiconductor memory according to the embodiment of the present invention.

As shown in FIGS. 17A and 17B, an element isolation insulating film 6 is buried in the groove portions 7 by CVD or the like so that the thickness of the element isolation insulating film 6 is approximately 200 nm to 1,500 nm. As shown in FIGS. 18A and 18B, the element isolation insulating film 6 is etched back by use of chemical-mechanical polishing (CMP) so that the element isolation insulating film 6 may be planarized. The upper surfaces of the element isolation insulating films 6 are situated in positions higher than the upper surfaces of the gate insulating films 12. As a result, the elements of the memory cell transistors $MT_{11}$ to $MT_{21}$ in the row direction are completely isolated from one another. Note that after removing the mask 5, shown FIGS. 16A and 16B, as shown in FIGS. 17A and 17B, the element isolation insulating film 6 is deposited, and the element isolation insulating film 6 may be planelized by CMP, as shown in FIGS. 18A and 18B.

Figure 19A:
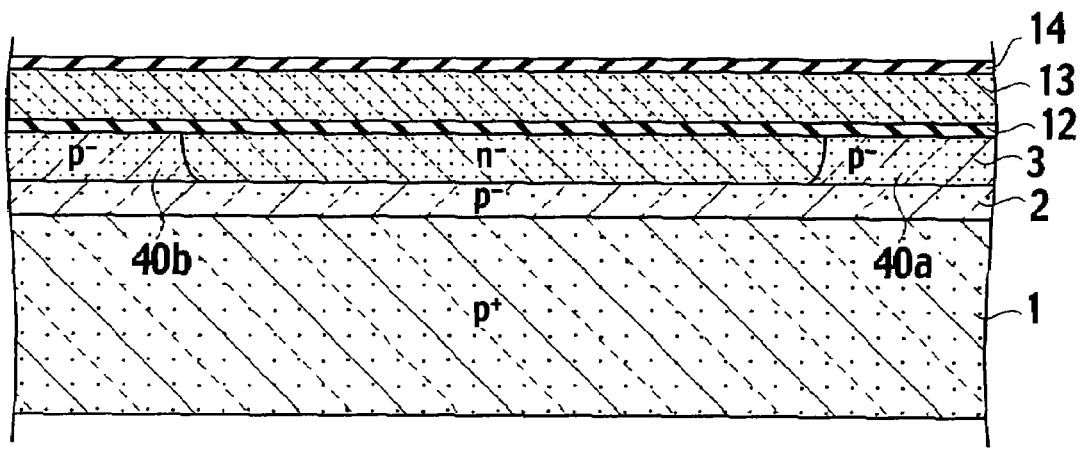
FIG. 19A is a cross-sectional view in the column direction after the process of FIG. 18A showing the method for manufacturing the non-volatile semiconductor memory according to the embodiment of the present invention.
Figure 19B:
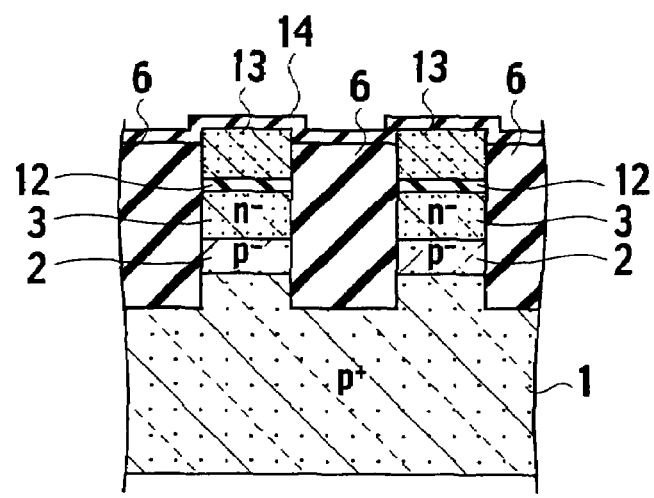
FIG. 19B is a cross-sectional view in the row direction after the process of FIG. 18B showing the method for manufacturing the non-volatile semiconductor memory according to the embodiment of the present invention.
Figure 20A:
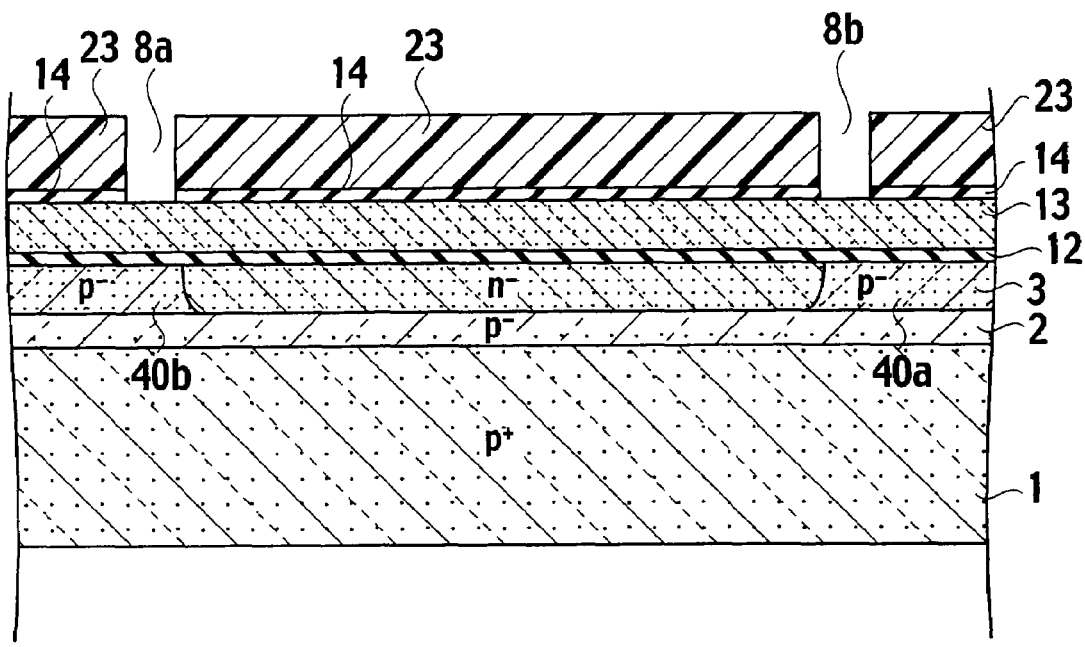
FIG. 20A is a cross-sectional view in the column direction after the process of FIG. 19A showing the method for manufacturing the non-volatile semiconductor memory according to the embodiment of the present invention.
Figure 20B:
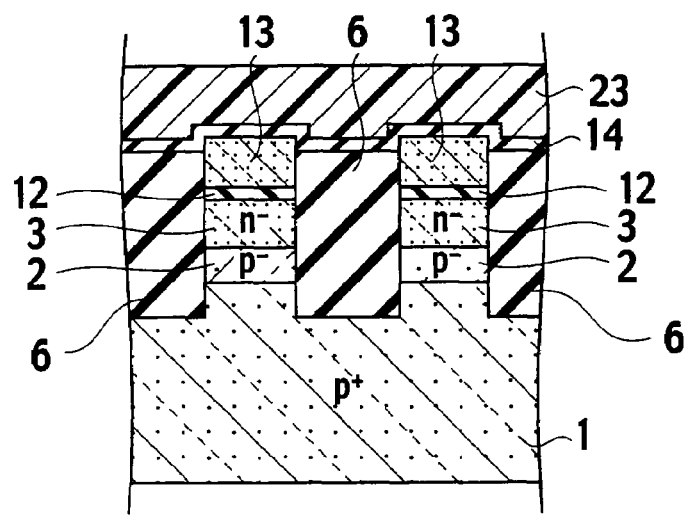
FIG. 20B is a cross-sectional view in the row direction after the process of FIG. 19B showing the method for manufacturing the non-volatile semiconductor memory according to the embodiment of the present invention.
Figure 21A:
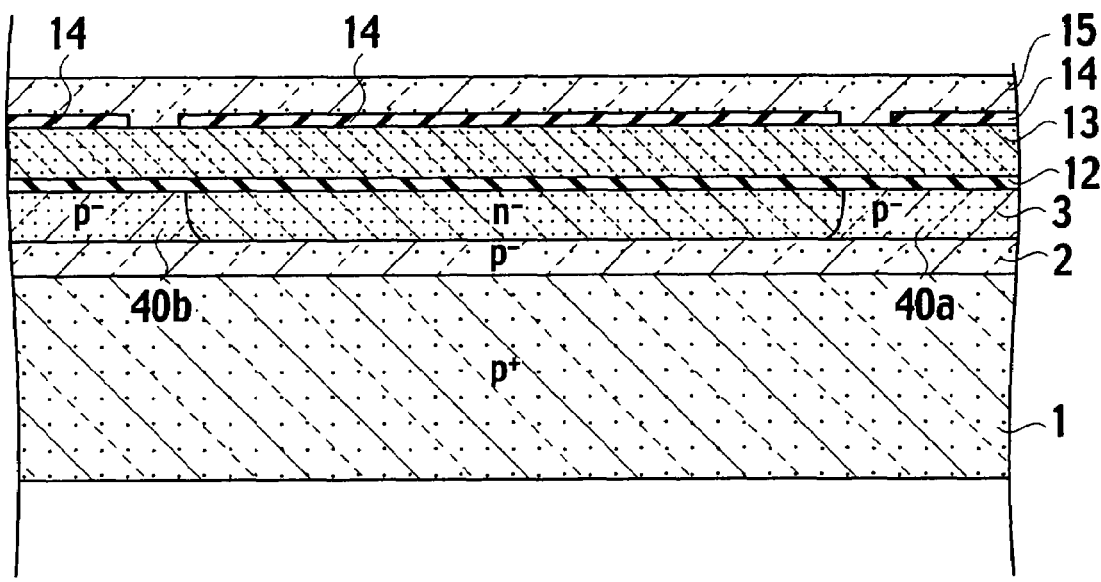
FIG. 21A is a cross-sectional view in the column direction after the process of FIG. 20A showing the method for manufacturing the non-volatile semiconductor memory according to the embodiment of the present invention.
Figure 21B:
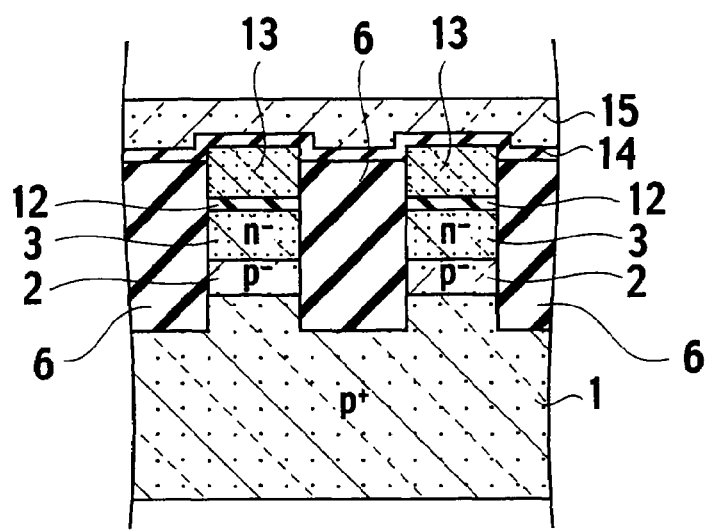
FIG. 21B is a cross-sectional view in the row direction after the process of FIG. 20B showing the method for manufacturing the non-volatile semiconductor memory according to the embodiment of the present invention.

As shown in FIGS. 19A and 19B, an inter-electrode insulating film 14 is deposited on the tops of the first polysilicon layers 13 and the tops of the element isolation insulating films 6 by CVD or the like. A resist film 23 is coated on the inter-electrode insulating film 14, and the resist film 23 is patterned by a lithographic technique. As shown in FIGS. 20A and 20B, opening portions 8 are formed in a part of the inter-electrode insulating film 14 by RIE or the like with the patterned resist film 23 used as a mask. As shown in FIGS. 21A and 21B, a P-doped second polysilicon layer (second conductive layer) 15, which will be a control gate electrode, is deposited on the inter-electrode insulating film 14 by CVD so that the thickness of the second polysilicon layer 15 is approximately 10 nm to 200 nm.

Figure 22A:
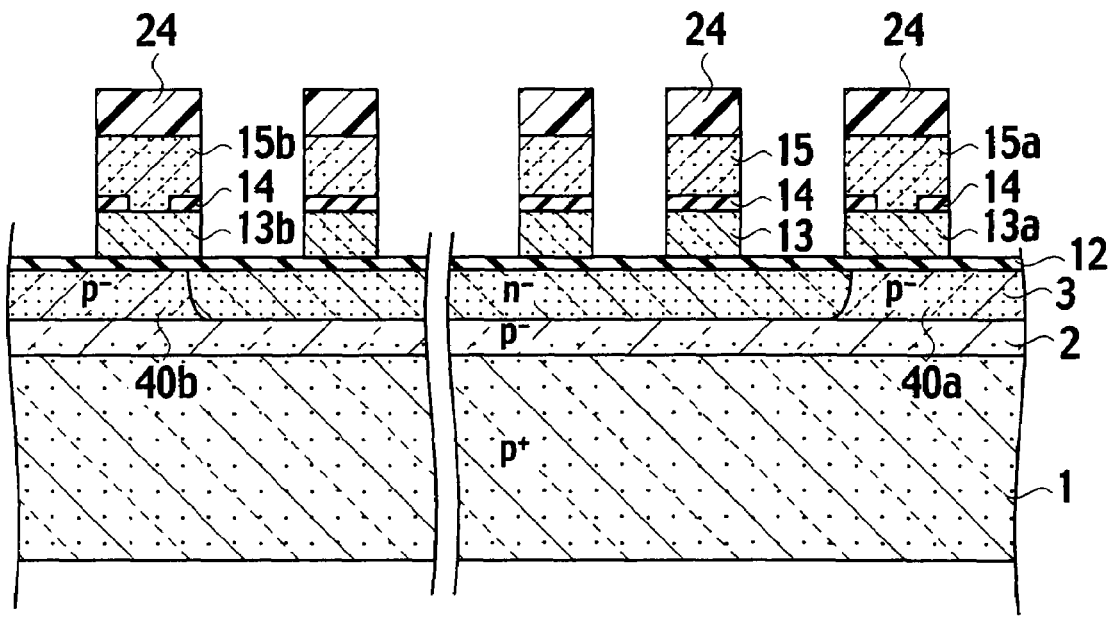
FIG. 22A is a cross-sectional view in the column direction after the process of FIG. 21A showing the method for manufacturing the non-volatile semiconductor memory according to the embodiment of the present invention.
Figure 22B:
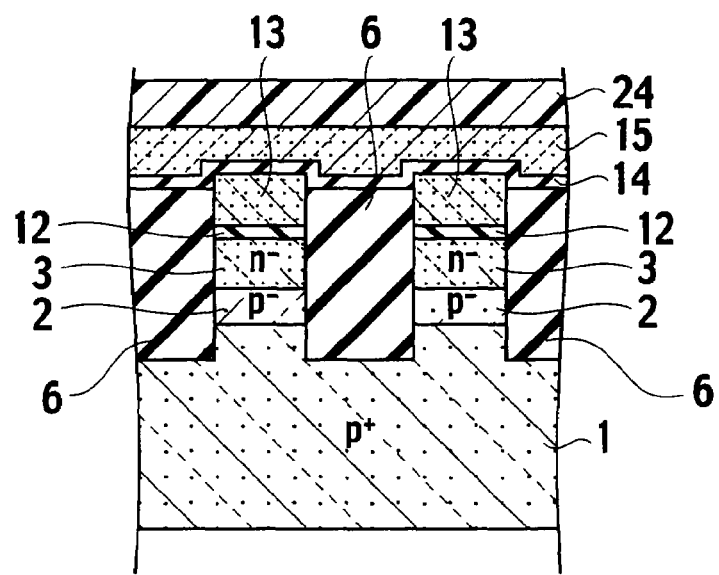
FIG. 22B is a cross-sectional view in the row direction after the process of FIG. 21B showing the method for manufacturing the non-volatile semiconductor memory according to the embodiment of the present invention.

A resist film 24 is coated on the second polysilicon layer 15, and the resist film 24 is patterned by a lithographic technique. As shown in FIGS. 22A and 22B, parts of the second polysilicon layer 15, the inter-electrode insulating layer 14, and the first polysilicon layer 13 are removed in the row direction, with the patterned resist film 24 used as a mask, by RIE in a selective manner until the gate insulating film 12 underneath the parts is exposed. As a result, grooves are formed and penetrate through the second polysilicon layer 15, the inter-electrode insulating film 14 and the first polysilicon layer 13. Patterns are formed having stacked structures of a control gate electrode 15, an inter-electrode insulating film 14 under the control gate electrode 15, a floating gate electrode 13 under inter-electrode insulating film 14 and a gate insulating film 12 under the floating gate electrode 13. The select gate electrodes 13a, 15a, 13b and 15b are formed in regions for forming select gate transistors. The resist film 24 is removed by a resist remover and the like.

Figure 24A:
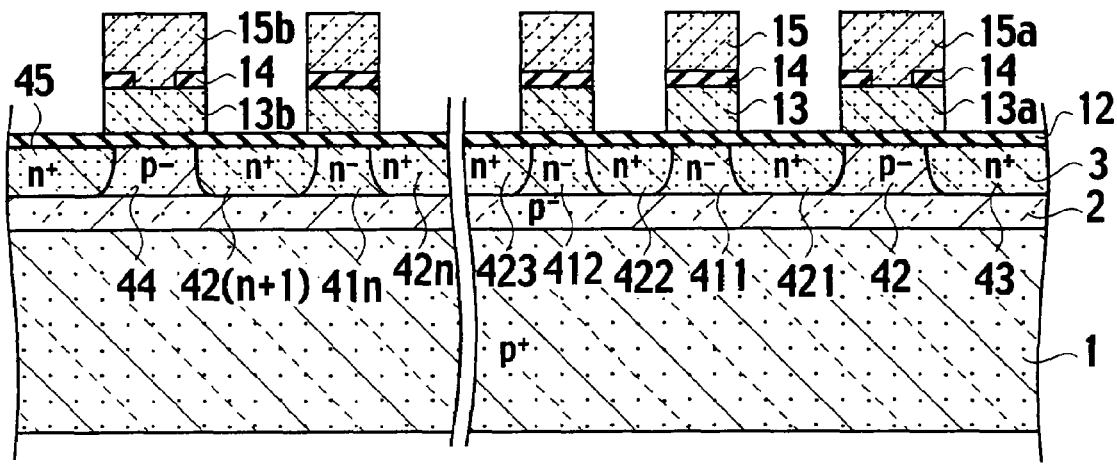
FIG. 24A is a cross-sectional view in the column direction after the process of FIG. 23A showing the method for manufacturing the non-volatile semiconductor memory according to the embodiment of the present invention.
Figure 24B:
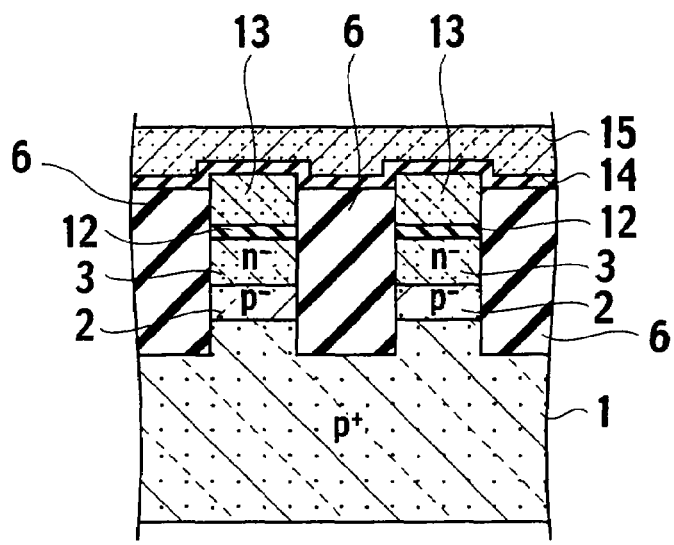
FIG. 24B is a cross-sectional view in the row direction after the process of FIG. 23B showing the method for manufacturing the non-volatile semiconductor memory according to the embodiment of the present invention.

Ions of $^{31}P^+$ or $^{75}As^+$ are implanted through the gate insulating films 12 in a self-aligned manner with the second polysilicon layer 15 used as a mask. Subsequently, n-type impurity ions of the first polysilicon layers 13 and the second polysilicon layers 15 are activated by thermal treatment. Thereby, the floating gate electrodes 13 and the control gate electrodes 15 are formed. As shown in FIGS. 24A and 24B, p-type impurity ions and n-type impurity ions in the third semiconductor layer 3 are activated. Accordingly, $n^+$-type impurity diffusion layers (source and drain regions) 421 to 42(n+1) are formed in the third semiconductor layer 3 and positioned at the bottom of grooves as shown in FIG. 1, and an $n^-$-type channel region 411 to 41(n+1) is formed in the third semiconductor layer 3 underneath the floating gate electrodes 13. Consequently, the depletion mode or enhancement mode memory cell transistor $MT_{11}$ to $MT_{1n}$ is formed. Consequently, the memory cell transistors, illustration omitted, cross in the column direction and in the row direction and the memory cell transistors are formed in a matrix.

Simultaneously, a $p^-$-type impurity diffusion layer (channel region) 42 is formed in the third semiconductor layer 3, and an $n^+$-type impurity diffusion layer (source region) 43 is formed. Thereby, an enhancement mode select gate transistor $STS_1$ is formed. Also, the $n^+$-type impurity diffusion layer (drain region) 45 and the $p^-$-type impurity diffusion layer (channel region) 44 between the drain region 45 and the source region 42(n+1) are formed. Thereby, the enhancement mode select gate transistor $STD_1$ is also formed.

Figure 25A:
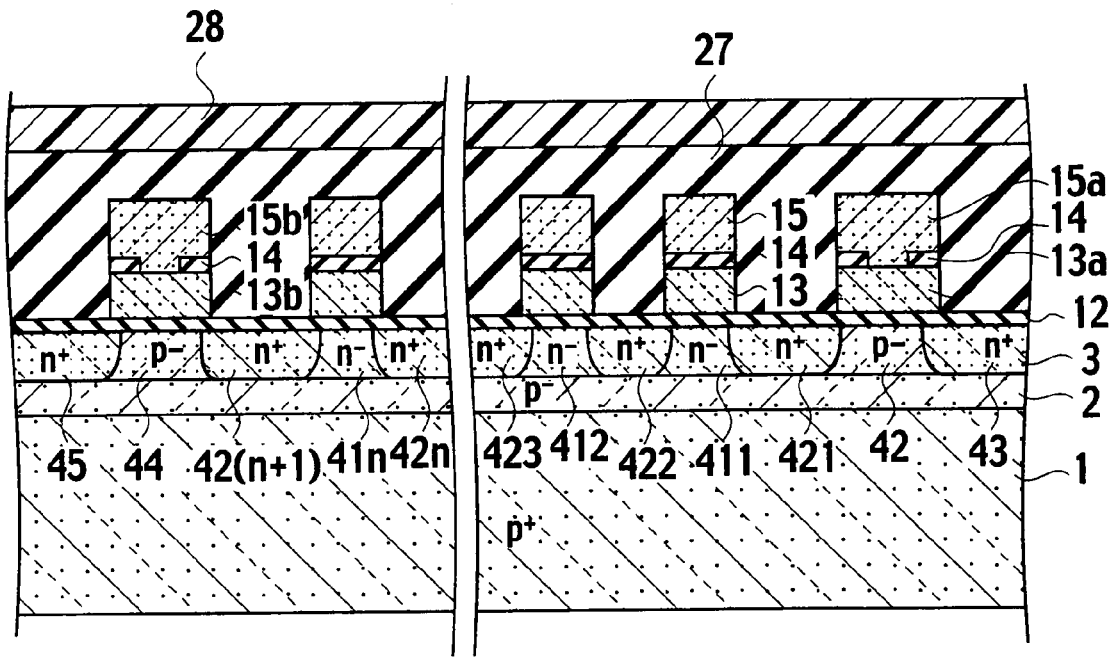
FIG. 25A is a cross-sectional view in the column direction after the process of FIG. 24A showing the method for manufacturing the non-volatile semiconductor memory according to the embodiment of the present invention.
Figure 25B:
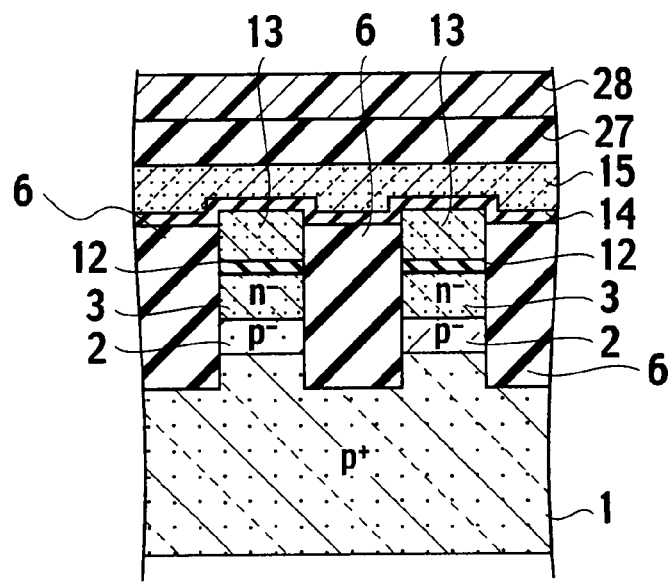
FIG. 25B is a cross-sectional view in the row direction after the process of FIG. 24B showing the method for manufacturing the non-volatile semiconductor memory according to the embodiment of the present invention.
Figure 26A:
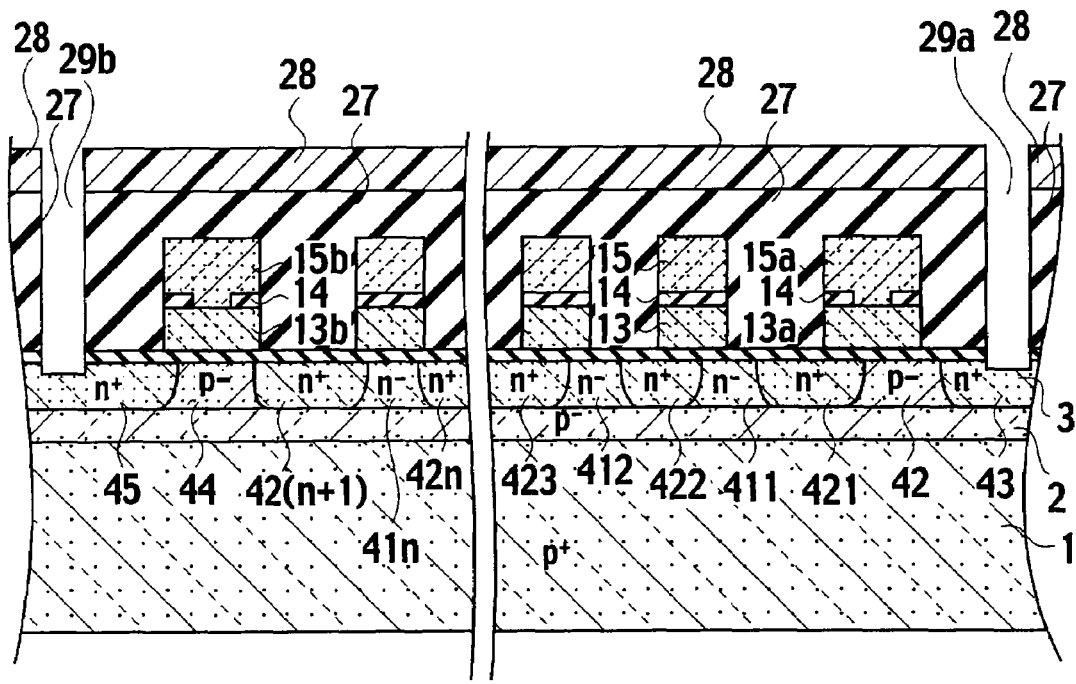
FIG. 26A is a cross-sectional view in the column direction after the process of FIG. 25A showing the method for manufacturing the non-volatile semiconductor memory according to the embodiment of the present invention.
Figure 26B:
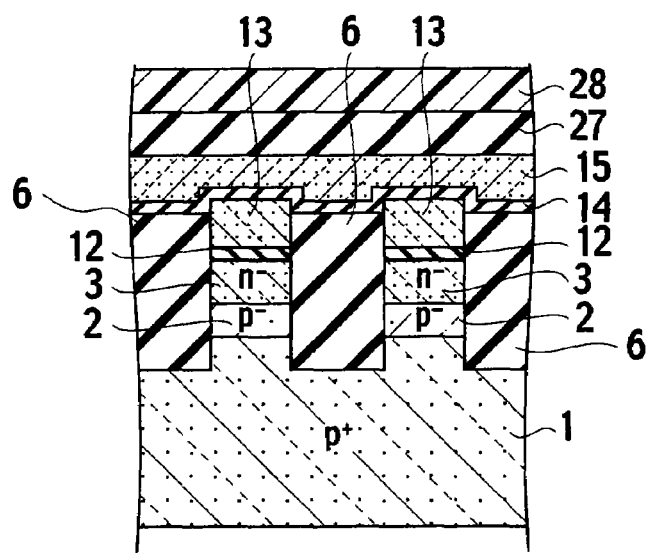
FIG. 26B is a cross-sectional view in the row direction after the process of FIG. 25B showing the method for manufacturing the non-volatile semiconductor memory according to the embodiment of the present invention.

Subsequently, as shown in FIGS. 25A and 25B, an interlayer insulating film 27 is deposited by CVD or the like and a resist film 28 is coated on the interlayer insulating film 27. Thereafter, the resist film 28 is patterned by lithography technology. As shown in FIGS. 26A and 26B, openings (contact holes) 29a and 29b are formed by RIE and the like using the patterned resist film 28 as a mask. The openings 29a and 29b penetrate the interlayer insulating film 27 and respectively extend to the source region 43 or the drain region 45. Thereafter, a metal film is buried in each of the openings 29a and 29b by CVD or the like to form the source line contact plug 18 and the bit line contact plug 17 so that the source line contact plug 18 and the bit line contact plug 17 are respectively connected to the source region 43 and the drain region 45. Finally, predetermined interconnects and insulating films are formed and deposited.

In accordance with the method for manufacturing the semiconductor storage device according to the embodiment shown in FIGS. 12A to 26B, the non-volatile semiconductor memory shown in FIG. 1 can be provided. Since the element isolation region (STI) 6 as shown in FIG. 1 does not have to be buried, a miniaturized process can be performed with ease.

Figure 40:
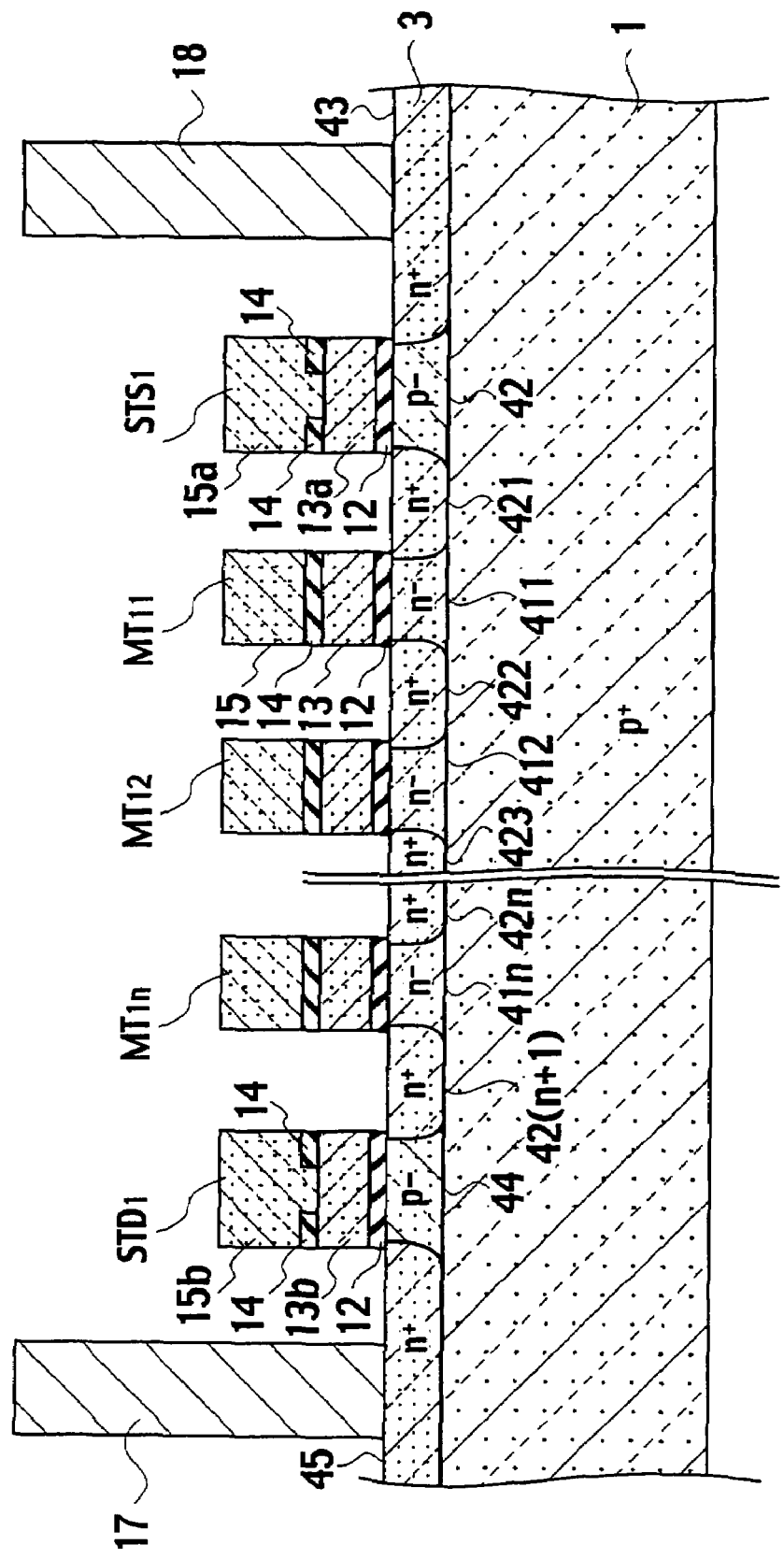
FIG. 40 is a cross-sectional view in the column direction showing another example of a cell array of a non-volatile semiconductor memory as a comparative example.

As shown in the comparative example of FIG. 40, for example, in the case of forming the n-type third semiconductor layer 3 on the p-type first semiconductor layer (semiconductor substrate) 1 without providing the second semiconductor layer 2, to thereby form the non-volatile semiconductor memory, the p-type impurities in the first semiconductor layer (semiconductor substrate) 1 are diffused into the n-type third semiconductor layer 3 by a heating step in the process, sometimes causing deterioration of the transistor characteristics.

The diffusion of the impurities is determined by a product of a diffusion coefficient D and a concentration gradient ΔN. According to the embodiments of the present invention, $N_{sub}>N$ is established and $N_{sub}-N_o>N-N_o$ is established where $N_{sub}$ is the p-type impurity concentration in the first semiconductor layer (semiconductor substrate) 1, N is the p-type impurity concentration of the p-type second semiconductor layer 2, and $N_o$ is the p-type impurity concentration in the third semiconductor layer 3. Hence, as compared with the concentration gradients of the p-type impurities of the third semiconductor layer 3 and the first semiconductor layer (semiconductor substrate) 1 in the case where the second semiconductor layer 2 is not present, which is shown in FIG. 40, gradually changing concentration gradients of the p-type impurities in the third semiconductor layer 3 and the second semiconductor layer 2 can be achieved by providing the second semiconductor layer 2. Therefore, the second semiconductor layer 2 can suppress the upward diffusion of the p-type impurities from the first semiconductor layer 1 to the third semiconductor layer 3 in the heating step of the process. Therefore, it is possible to suppress deterioration of the transistor characteristics.

(First Modification)

Figure 27:
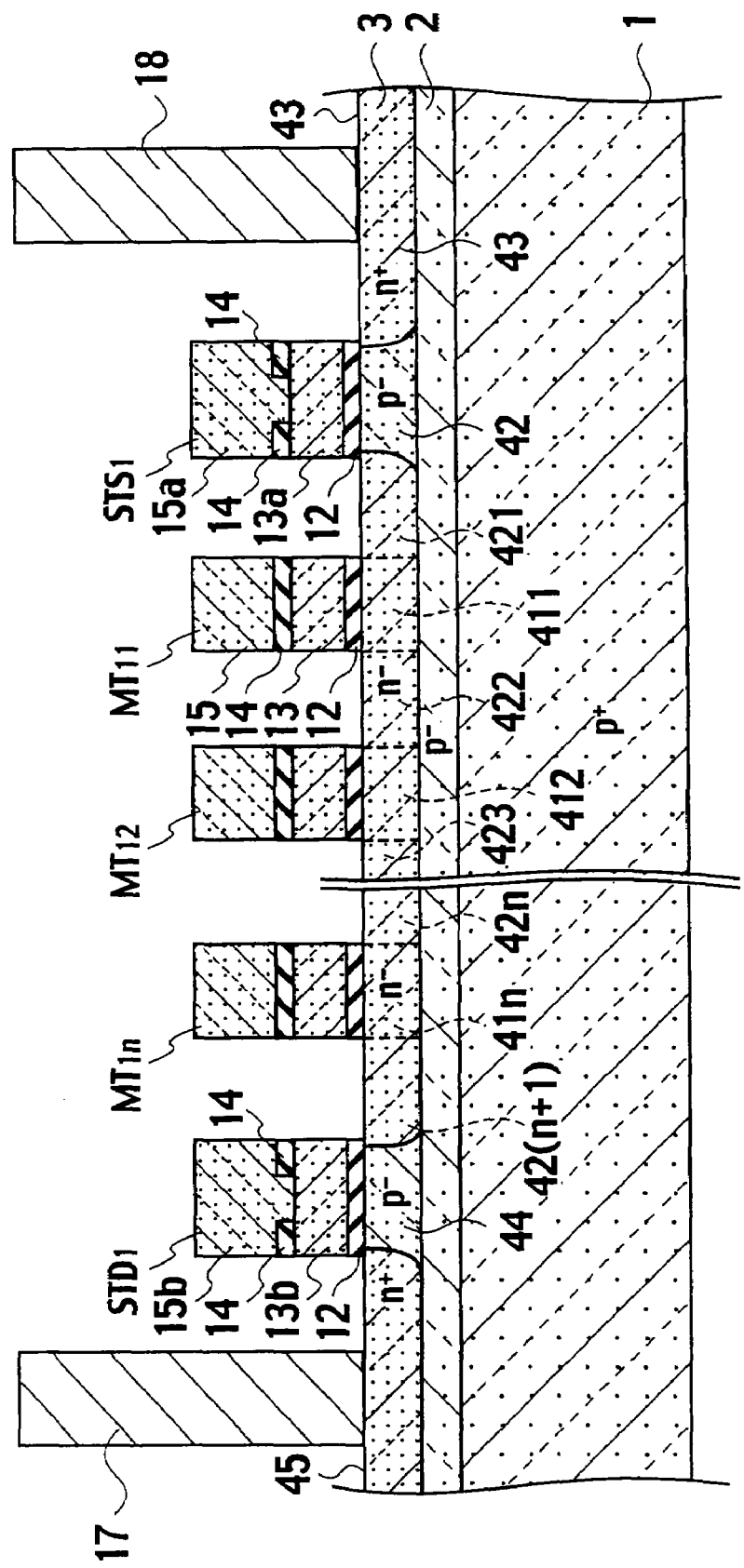
FIG. 27 is a cross-sectional view in the column direction showing an example of a cell array of a non-volatile semiconductor memory according to a first modification of the present invention.

In a non-volatile semiconductor memory according to a first modification, as shown in FIG. 27, the source regions and drain regions 421 to 42 (n+1) may be $n^-$-type with an impurity concentration substantially equivalent to that of the $n^-$-type channel regions 411 to 41n of the memory cell transistors $MT_{11}$ to $MT_{1n}$. Also in this case, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

Figure 23A:
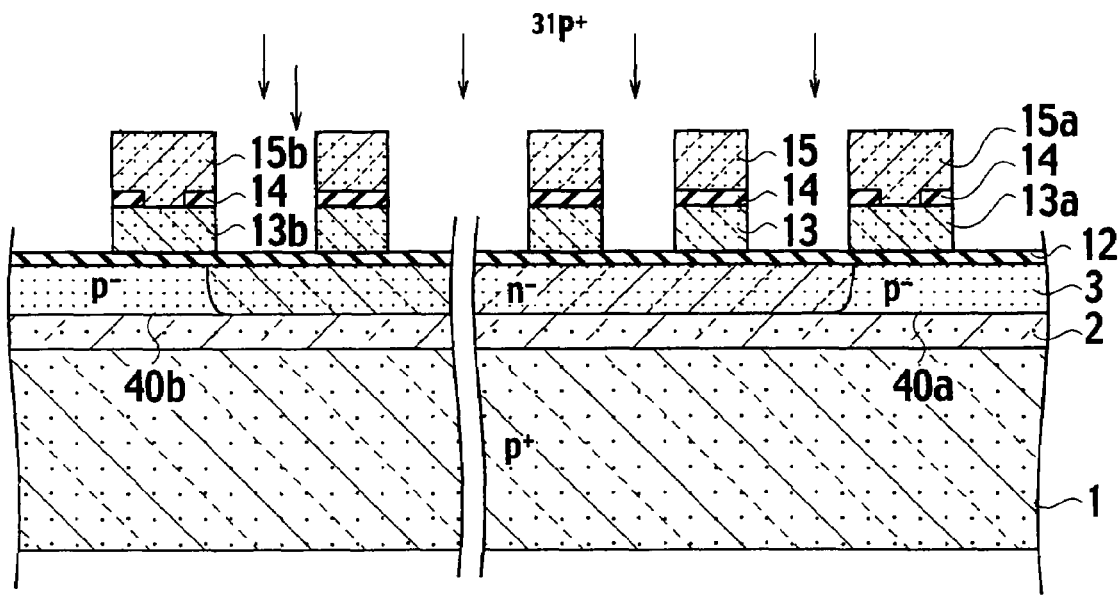
FIG. 23A is a cross-sectional view in the column direction after the process of FIG. 22A showing the method for manufacturing the non-volatile semiconductor memory according to the embodiment of the present invention.
Figure 23B:
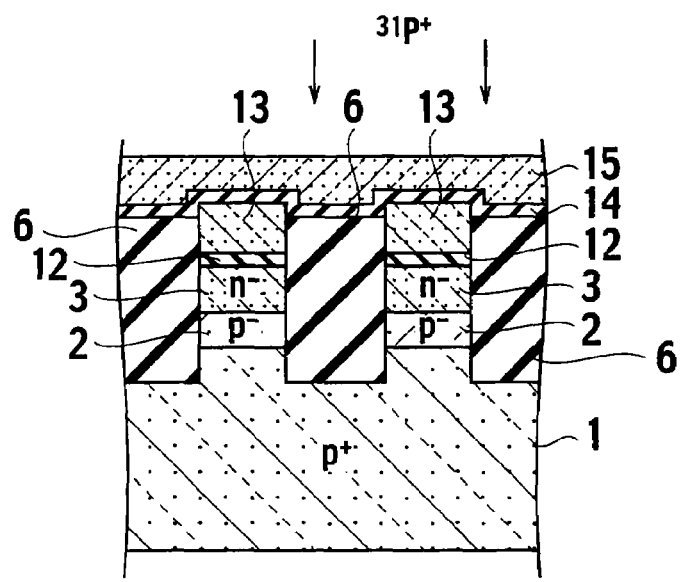
FIG. 23B is a cross-sectional view in the row direction after the process of FIG. 22B showing the method for manufacturing the non-volatile semiconductor memory according to the embodiment of the present invention.

With regard to an example of a method for manufacturing the non-volatile semiconductor memory according to the first modification, the ion implantation process of FIGS. 23A and 23B and the thermal treatment process of FIGS. 24A and 24B is omitted. Therefore, the process can be simplified as compared with the non-volatile semiconductor memory shown in FIG. 1, and this modification is suitable also for miniaturization of the non-volatile semiconductor memory. Since other steps in the procedure are substantially the same as those in FIGS. 13A and 26B, a redundant description thereof will be omitted.

(Second Modification)

In a non-volatile semiconductor memory according to a second modification, the second semiconductor layer 2 shown in FIG. 1 is a semi-insulating semiconductor layer (intrinsic semiconductor layer), in which the impurity concentration may be lower than that of the first semiconductor layer (semiconductor substrate) 1 and the third semiconductor layer 3.

The second semiconductor layer 2 formed by the semi-insulating semiconductor is interposed between the third semiconductor layer 3 and the first semiconductor layer (semiconductor substrate) 1. Thus, even if a reverse bias is applied, the electric field of the junction portion is absorbed. Therefore, it is possible to improve the breakdown voltage.

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example of a method for manufacturing the non-volatile semiconductor memory according to the second modification, in the procedure shown in FIGS. 12A and 12B, the semi-insulating semiconductor layer (second semiconductor layer) 2 is epitaxially grown on the p-type first semiconductor layer (semiconductor substrate) 1. Thereafter, the n-type epitaxial layer (third semiconductor layer) 3 in which the impurity concentration is higher than that of the second semiconductor layer 2 is grown on the second semiconductor layer 2. Since other steps in the procedure are substantially the same as those in FIGS. 13A and 26B, a redundant description thereof will be omitted.

In the heating step in the process, the p-type impurities are diffused from the first semiconductor layer (semiconductor substrate) 1 through the second semiconductor layer 2 to the third semiconductor layer 3, and the amount of diffused p-type impurities is decreased in accordance with the thickness of the second semiconductor layer 2. Therefore, the diffusion of the p-type impurities into the third semiconductor layer 3 is suppressed. Simultaneously, the n-type impurities are diffused from the third semiconductor layer 3 into the second semiconductor layer 2, and the pn junction is newly formed in the second semiconductor layer 2. Hence, the deterioration of the transistor characteristics can be suppressed.

(Third Modification)

A non-volatile semiconductor memory according to a third modification is characterized in that the second semiconductor layer 2, shown in FIG. 1, contains either carbon (C) atoms or oxygen (O) atoms, or both C and O atoms.

Sheet resistance of the second semiconductor layer 2 increases by the impurities implanted thereto. Therefore, even if a reverse bias is applied to the second semiconductor layer 2, the leak current can be suppressed.

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example of a method for manufacturing the non-volatile semiconductor memory according to the third modification, in the procedure shown in FIGS. 12A and 12B, at least either the C and O atoms are ion-implanted in the vicinity of the surface of the p-type first semiconductor layer (semiconductor substrate) 1, followed by the thermal treatment thereof, and the second semiconductor layer 2 containing at least either the C atoms and the O atoms is thus formed. Thereafter, the n-type epitaxial layer (third semiconductor layer) 3 is grown on the second semiconductor layer 2. Since other steps in the procedure are substantially the same as those in FIGS. 13A and 26B, a redundant description thereof will be omitted.

The second semiconductor layer 2 into which the C atoms and the O atoms are implanted is interposed between the third semiconductor layer 3 and the first semiconductor layer (semiconductor substrate) 1, and the second semiconductor layer 2 thus getters (catches) B as the p-type impurities from the first semiconductor layer 1. Accordingly, the diffusion of the impurities into the third semiconductor layer 3 can be suppressed. Therefore, it is possible to suppress the deterioration of the transistor characteristics.

(Fourth Modification)

In a non-volatile semiconductor memory according to a fourth modification, a description will be made of an example where the second semiconductor memory 2 is of the first conductivity type (p-type) in which the impurity concentration is lower than that of the first semiconductor layer (semiconductor substrate) 1, and contains p-type impurities having a larger atomic weight than the p-type impurities contained in the first semiconductor layer (semiconductor substrate) 1. For example, if the p-type impurities contained in the first semiconductor layer (semiconductor substrate) 1 are B, then aluminum (Al), gallium (Ga), indium (In), thallium (Tl), or the like is usable as the p-type impurities having a larger atomic weight than that of B.

The second semiconductor layer 2 with a low impurity concentration is interposed between the third semiconductor layer 3 and the first semiconductor layer (semiconductor substrate) 1. Thus, even if a reverse bias is applied, the electric field of the junction portion is absorbed. Therefore, it is possible to improve the breakdown voltage.

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to a method for manufacturing the non-volatile semiconductor memory according to the fourth modification, in the procedure shown in FIGS. 12A and 12B, a p-type or n-type epitaxial layer is formed on the p-type first semiconductor layer (semiconductor substrate) 1. Subsequently, the p-type impurities having a larger atomic weight than that of the p-type impurities contained in the first semiconductor layer (semiconductor substrate) 1 are ion-implanted into the epitaxial layer. Thereafter, the n-type epitaxial layer is grown. Since other steps in the procedure are substantially the same as those in FIGS. 13A and 26B, a redundant description thereof will be omitted.

The diffusion of the impurities is determined by the product of the diffusion coefficient D and the concentration gradient $\Delta N$. In general, atoms having a larger atomic weight have an atomic radius larger than that of atoms having a atomic weight. In the atoms having a larger atomic weight, the diffusion of the impurities among lattices is suppressed.

This means that the diffusion coefficient D is decreased. Hence, the diffusion of the impurities from the first semiconductor layer 1 to the third semiconductor layer 3 can be suppressed by the second semiconductor layer 2. Therefore, it is possible to suppress the deterioration of the transistor characteristics.

(Fifth Modification)

In a non-volatile semiconductor memory according to a fifth modification, the second semiconductor layer 2 contains first conductivity type (p-type) or second conductivity type (n-type) silicon carbide (SiC).

A SiC layer having a high dielectric breakdown electric field is interposed between the third semiconductor layer 3 and the first semiconductor layer (semiconductor substrate) 1. Thus, even if a reverse bias is applied, breakdown resistance of the junction portion is increased. Therefore, it is possible to improve the breakdown voltage.

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example a method for manufacturing the non-volatile semiconductor memory according to the fifth modification, in the procedure shown in FIGS. 12A and 12B, the second semiconductor layer 2, as the p-type or n-type 3C-SiC epitaxial layer, is formed on the first semiconductor layer (semiconductor substrate) 1. Thereafter, the third semiconductor layer 3, as the n-type epitaxial layer (Si layer), is grown on the second semiconductor layer 2. Since other steps in the procedure are substantially the same as those in FIGS. 13A and 26B, a redundant description thereof will be omitted.

With regard to the diffusion of the impurities, there are two routes for the diffusion: (1) where the impurities are diffused among the lattices, and (2) where the impurities move through lattice points. When the first semiconductor layer (semiconductor substrate) 1 is an Si substrate, 3C-SiC can be epitaxially grown from the surface of Si, and Si can be epitaxially grown again from the surface of 3C-SiC. Here, 3C represents the SiC as having a tricyclic cubic structure. 3C-SiC has a crystalline structure of a zinc blend type, in which gaps among the lattices are narrower as compared with Si single crystals with a diamond structure. Therefore, it is more difficult for the impurities to diffuse among the lattices of 3C-SiC as compared with the Si single crystals, and the diffusion of the p-type impurities from the first semiconductor layer (semiconductor substrate) 1 into the third semiconductor layer 3 can be suppressed.

When the impurities move through the lattice points, for example, when B moves through the lattice points of Si, a process is repeated, in which B is first replaced for the Si lattice points, Si—B bonding is subsequently cut, B retains among the lattices, and B extrudes and is substituted for the Si atoms next thereto. However, in the case where B is going to move through the lattice points of 3C-SiC, when B replaces the Si lattice points, C and B are bonded together since C is present on the peripheries of the Si lattice points. Since this C—B bonding is stronger than the Si—B bonding, the C—B bonding is not cut easily, and movement of B is suppressed. Moreover, when B replaces the C lattice points, B cuts the Si—B bonding, and begins to move through the lattice points. However, at the time when B is substituted for the lattice points of Si, B is bonded to C, and the movement thereof is suppressed. Hence, the diffusion of the p-type impurities from the first semiconductor layer (semiconductor substrate) 1 to the third semiconductor layer 3 can be suppressed.

Note that an n-type 3C-SiC epitaxial layer may be formed as the third semiconductor layer (SiC layer) 3 on the second semiconductor layer 2. The diffusion of the impurities into the SiC layer is less than the diffusion thereof into Si. Hence, the diffusion of the impurities from the second semiconductor layer into the third semiconductor layer 3 can be prevented.

(Sixth Modification)

In a non-volatile semiconductor memory according to a sixth modification, the second semiconductor layer 2 shown in FIG. 1 contains p-type or n-type SiGe, in which an impurity concentration of SiGe is lower than the impurity concentration of the first semiconductor layer (semiconductor substrate) 1.

The low impurity concentration SiGe layer is interposed between the third semiconductor layer 3 and the first semiconductor layer (semiconductor substrate) 1. Thus, the sheet resistance of the second semiconductor layer 2 increases, and even if a reverse bias is applied, the leak current can be suppressed.

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example of a method for manufacturing the non-volatile semiconductor memory according to the sixth modification, in the procedure shown in FIGS. 12A and 12B, the second semiconductor layer 2, as the p-type or n-type SiGe epitaxial layer, is formed on the p-type first semiconductor layer (semiconductor substrate) 1. Thereafter, the n-type Si epitaxial layer (third semiconductor layer) 3 is grown on the second semiconductor layer 2. Since other steps in the procedure are substantially the same as those in FIGS. 13A and 26B, a redundant description thereof will be omitted.

The diffusion of the p-type impurity ions (for example, B) in the SiGe is slower than the diffusion thereof in Si. Therefore, the diffusion of the p-type impurities from the first semiconductor layer (semiconductor substrate) 1 into the third semiconductor layer 3 can be suppressed by the second semiconductor layer 2.

(Seventh Modification)

Figure 28:
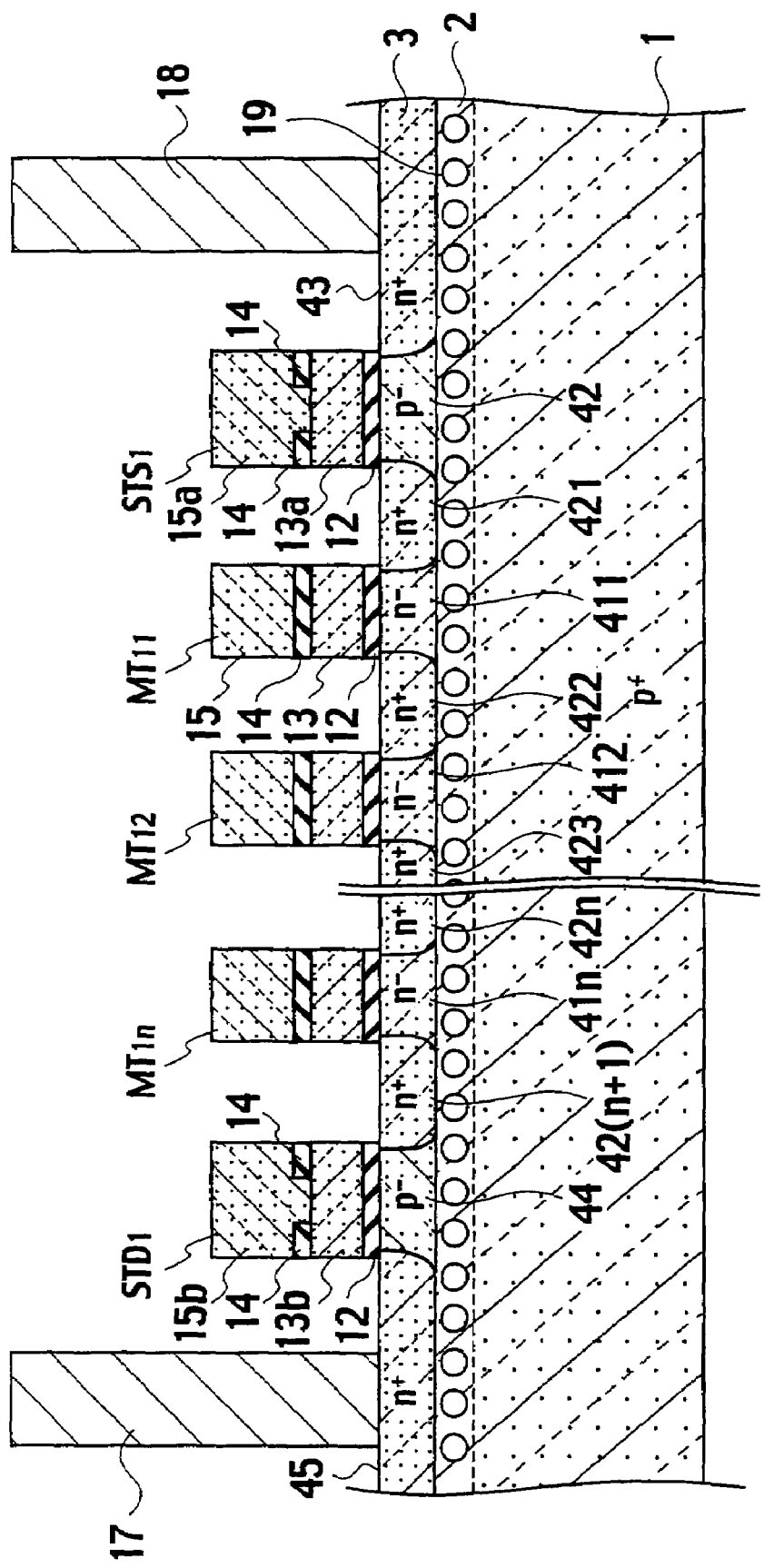
FIG. 28 is a cross-sectional view in the column direction showing an example of a cell array of a non-volatile semiconductor memory according to a seventh modification of the present invention.

In a non-volatile semiconductor memory according to a seventh modification, as shown in FIG. 28, a SON (Silicon On Nothing) substrate is used in which vacant spaces 19 are present in the vicinity of the surface of the Si substrate. The vacant spaces 19 of the second semiconductor layer 2 have a diameter of approximately several ten to several hundred nanometers. The second semiconductor layer 2 including the vacant spaces 19 is interposed between the first semiconductor layer 1 and the channel regions 411 to 41n. Thus, current paths between the first semiconductor layer 1 and the channel regions 411 to 41n are decreased, and substantial resistance increases. Therefore, even if a reverse bias is applied, the leak current can be suppressed.

Furthermore, in a similar way to the embodiments of the present invention, the memory cell transistors $MT_{11}$ to $MT_{1n}$ are the depletion type or the enhancement type having source and drain regions 421 to 42(n+1) and channel regions 411 to 41n of the same conductivity type. Accordingly, the influence of the short channel effect can be decreased.

With regard to an example of a method for manufacturing the non-volatile semiconductor memory according to the seventh modification, in the procedure shown in FIGS. 12A and 12B, the first semiconductor layer (Si substrate) 1 is prepared, and trenches are formed with a trench width of several tens of nanometers to several hundred nanometers on the first semiconductor layer 1 by photolithography technology and etching technology. When the Si substrate on which the trenches are formed are annealed in a hydrogen atmosphere, apexes of the trenches migrate, the apexes adjacent to each other adhere to each other. Insides of the trenches where the adjacent apexes are adhered to each other retain as the vacant spaces 19 with a diameter of several ten to several hundred nanometers, and the SON substrate is formed. Thereafter, the third semiconductor layer (SON layer) 3 is epitaxially grown on the surface of the SON substrate. Since other steps in the procedure are substantially the same as those in FIGS. 13A and 26B, a redundant description thereof will be omitted.

The p-type impurities in the first semiconductor layer 1 and the second semiconductor layer 2 are gettered (catched) on inner surfaces of the vacant spaces 19, and the impurities are accumulated on the inner surfaces of the vacant spaces 19. Thus, the impurity concentration in the vicinity of the vacant spaces 10 is decreased. Thus, the concentration gradient of the p-type impurities from the first semiconductor layer 1 to the third semiconductor layer (SON layer) 3 is decreased. Hence, the diffusion of the impurities into the third semiconductor layer (SON) layer 3 can be suppressed. Therefore, it is possible to suppress deterioration of the transistor characteristics.

(Eighth Modification)

Figure 29:
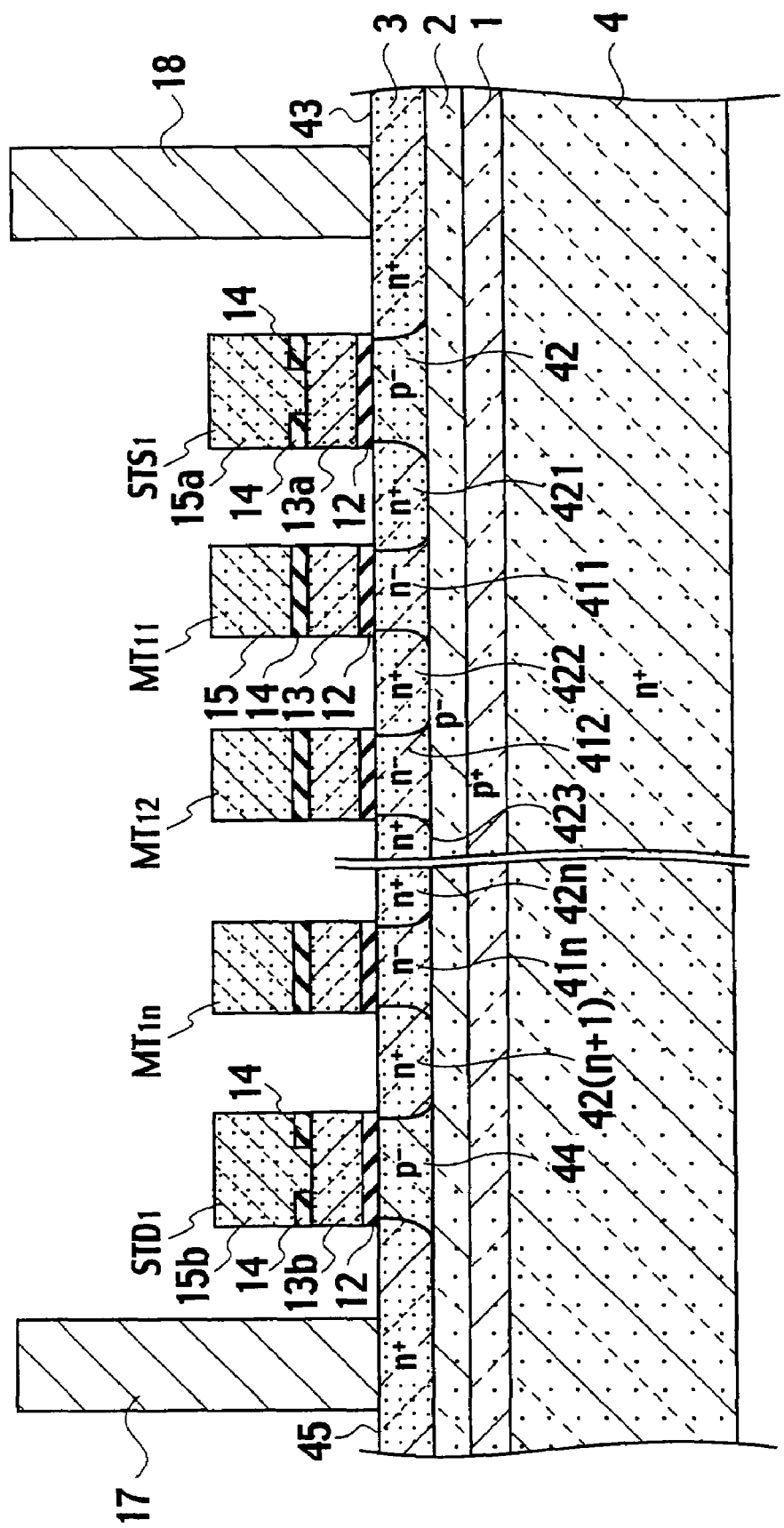
FIG. 29 is a cross-sectional view in the column direction showing an example of a cell array of a non-volatile semiconductor memory according to an eighth modification of the present invention.

In a non-volatile semiconductor memory according to an eighth modification, as shown in FIG. 29, the first semiconductor layer 1, as a $p^+$-type epitaxial layer, is disposed on a fourth semiconductor layer (semiconductor substrate) 4 of the second conductivity type ($n^+$-type). Specifically, it is not necessary for the first semiconductor layer 1 to be the semiconductor substrate if the first semiconductor layer 1 is of the first conductivity type (p-type).

Furthermore, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example of a method for manufacturing the non-volatile semiconductor memory according to the eight modification, for example, the p-type first semiconductor layer 1 is epitaxially grown on the $n^+$-type fourth semiconductor layer 4, and the p-type impurities are ion-implanted therein at a predetermined concentration. Subsequently, after the n-type third semiconductor layer 3 is epitaxially grown on the second semiconductor layer 2, the n-type impurities are ion-implanted therein at a predetermined concentration. Note that the first to third semiconductor layers 1 to 3 may be individually formed only by the epitaxial growth without performing any or all of the ion implantation of the p-type impurities into the first semiconductor layer 1, the ion implantation of the p-type impurities into the second semiconductor layer 2, and the ion implantation of the n-type impurities into the third semiconductor layer 3.

Alternatively, after the p-type semiconductor layer 1 is epitaxially grown on the $n^+$-type fourth semiconductor layer 4, the p-type second semiconductor layer 2 is epitaxially grown, and the n-type impurities are ion-implanted into the surface of the second semiconductor layer 2. Thus, also, the third semiconductor layer 3 may be formed on the second semiconductor layer 2.

Alternatively, after the p-type first semiconductor layer 1 is epitaxially grown on the $n^+$-type fourth semiconductor layer 4, the n-type third semiconductor layer 3 is grown on the first semiconductor layer 1, and the p-type impurities are ion-implanted into the bottom of the third semiconductor layer 3. Thus, also, the second semiconductor layer 2 may be formed on the bottom of the third semiconductor layer 3.

Since other steps in the procedure are substantially the same as those in FIGS. 13A and 26B, a redundant description thereof will be omitted.

(Ninth Modification)

Figure 30:
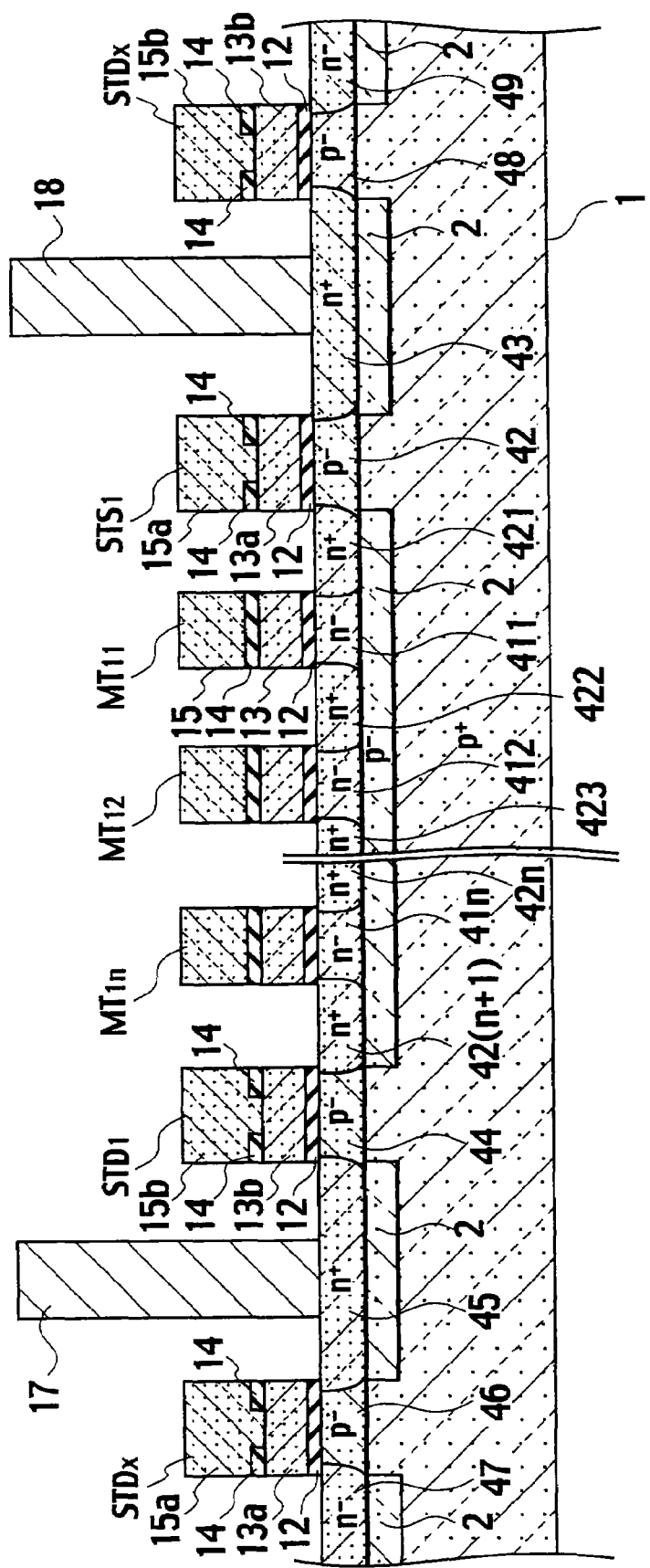
FIG. 30 is a cross-sectional view in the column direction showing an example of a cell array of a non-volatile semiconductor memory according to a ninth modification of the present invention.

In a non-volatile semiconductor memory according to a ninth modification, a description will be made of peripheral portions of the memory cells. As shown in FIG. 30, the second semiconductor layer 2 is selectively disposed under the linear arrangement of the memory cell transistors $MT_{11}$ to $MT_{1n}$, the source region 43 of the select gate transistor $STS_1$, and the drain region 45 of the select gate transistor $STD_1$. Therefore, the channel regions 42 and 44 of the select gate transistors $STS_1$ and $STD_1$ are brought into contact with the first semiconductor layer 1.

Also in this case, in a similar way to the embodiments of the present invention, the memory cell transistors $MT_{11}$ to $MT_{1n}$ are of the depletion type or the enhancement type, which have the source and drain regions 421 to 42(n+1) and the channel regions 411 to 41n of the same conductivity type. Accordingly, the influence of the short channel effect can be decreased.

With regard to an example of a method for manufacturing the non-volatile semiconductor memory according to the ninth modification, the n-type impurities are selectively ion-implanted into regions where the memory cell transistors $MT_{11}$ to $MT_{1n}$ are formed and regions where the source region 43 and the drain region 421 of the select gate transistor $STS_1$ and the source region 42(n+1) and the drain regions 45 of the select gate transistor and $STD_1$ are formed, those regions being in the second semiconductor layer 2. Thereafter, the floating gate electrodes 13, the inter-electrode insulating films 14, the control gate electrodes 15, the select gate electrodes 13a, 15a, 13b and 15b, the bit line contact plugs 17, and the source line contact plugs 18 are formed. Thus, it becomes possible to manufacture the non-volatile semiconductor memory shown in FIG. 30.

The second semiconductor layer 2 is provided between the $p^+$-type first semiconductor layer (semiconductor substrate) 1 and the channel regions 411 to 41n, and the impurities in the first semiconductor layer 1 can be thus prevented from being diffused into the channel regions 411 to 41n. Therefore, it is possible to prevent deterioration of the transistor characteristics.

Moreover, when the n-type channel regions 411 to 41n are present on the p-type first semiconductor layer 1, it is not preferable that the p-type impurities be diffused into the n-type channel regions 411 to 41n in the memory cell regions. However, since the select gate transistors $STS_1$ and $STD_1$ of the n channels are formed in the select gate regions, it is necessary that the source region 43 and the drain region 421 of the select gate transistor $STS_1$ and the source region 42(n+1) and the drain regions 45 of the select gate transistor $STD_1$ be of the n type, and that the channel regions 42 and 44 under the insulating gates be of the p type. Accordingly, the third semiconductor layer 3 is not selectively provided in the channel regions 42 and 44 under the insulating gates. Thus, the p-type impurities in the first semiconductor layer (Si substrate) 1 are diffused into the n-type third semiconductor layer 3 deposited on the channel regions 42 and 44 by the subsequent heating step. Therefore, it is possible to form the p-type channel regions 42 and 44 of the select gate transistors $STS_1$ and $STD_1$ easily.

Figure 31:
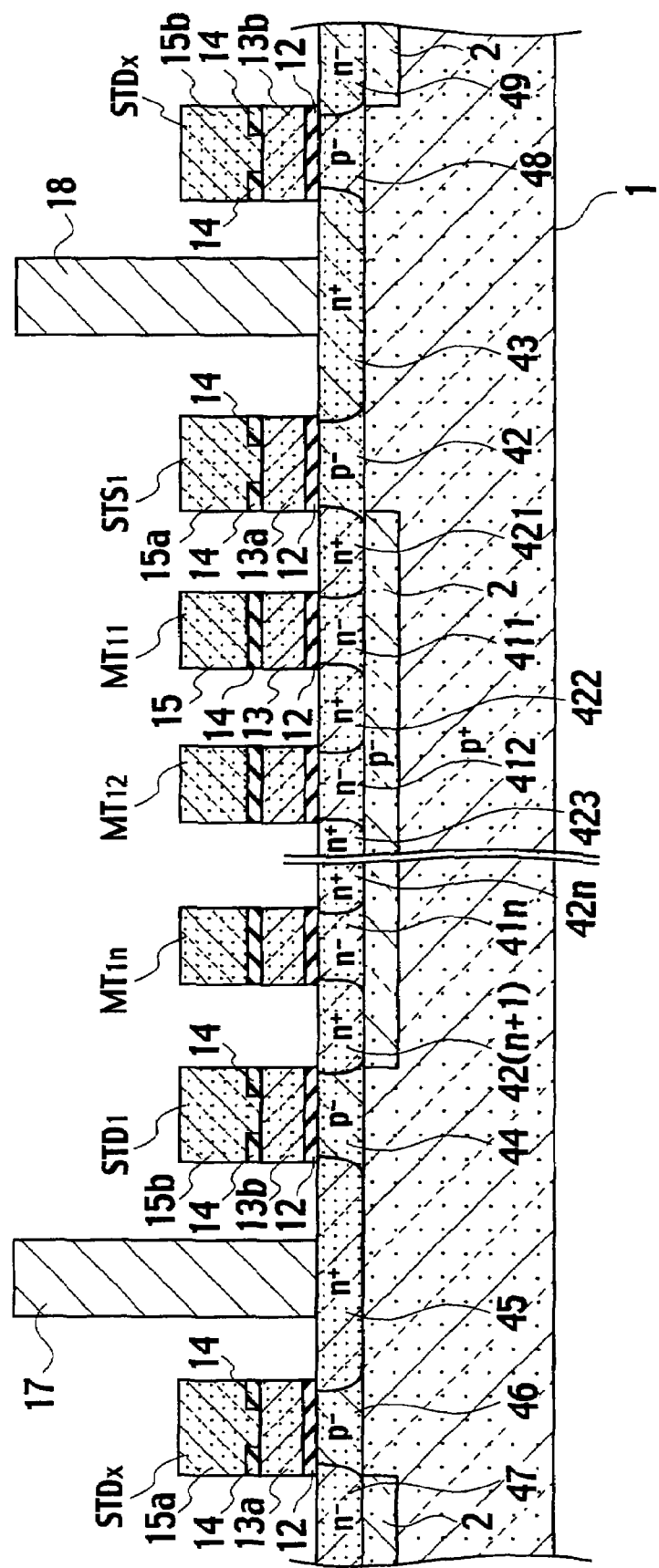
FIG. 31 is a cross-sectional view in the column direction showing another example of a cell array of a non-volatile semiconductor memory according to a ninth modification of the present invention.

Moreover, as another example, as shown in FIG. 31, the second semiconductor layer 2 is selectively disposed under the linear arrangement of the memory cell transistors $MT_{11}$ to $MT_{1n}$. Therefore, the channel region 42 and source region 43 of the select gate transistor $STS_1$ and the channel region 44 and drain region 45 of the select gate transistor $STD_1$ are brought into contact with the first semiconductor layer 1.

With regard to an example of a method for manufacturing the non-volatile semiconductor memory shown in FIG. 31, the n-type impurities are selectively ion-implanted into the regions where the memory cell transistors $MT_{11}$ to $MT_{1n}$ are formed and the regions where the source region 43 and the drain region 421 of the select gate transistor $STS_1$ and the source region 42(n+1) and the drain regions 45 of the select gate transistor and $STD_1$ are formed, those regions being in the second semiconductor layer 2. The third semiconductor layer 3 is not selectively provided in the regions under the select gate transistors $STS_1$, $STD_1$, and the bit line contact plugs 17 and the source line contact plugs 18. The p-type impurities in the first semiconductor layer (Si substrate) 1 are diffused by the subsequent heating step. Therefore, it is possible to form the p-type channel regions 42 and 44 of the select gate transistors $STS_1$ and $STD_1$ easily. Thereafter, the floating gate electrodes 13, the inter-electrode insulating films 14, the control gate electrodes 15, the select gate electrodes 13a, 15a, 13b and 15b, the bit line contact plugs 17, and the source line contact plugs 18 are formed. Thus, it is possible to provide the non-volatile semiconductor memory shown in FIG. 31.

(Tenth Modification)

In a method for manufacturing a non-volatile semiconductor memory according to a tenth modification, only the p-type impurities are ion-implanted into the entire surface of the n-type channel layer, instead of selectively ion-implanting the p-type impurities into the n-type channel layer. Subsequently, the procedures shown in FIG. 14A to FIG. 22B are performed in a substantially similar way.

Figure 32:
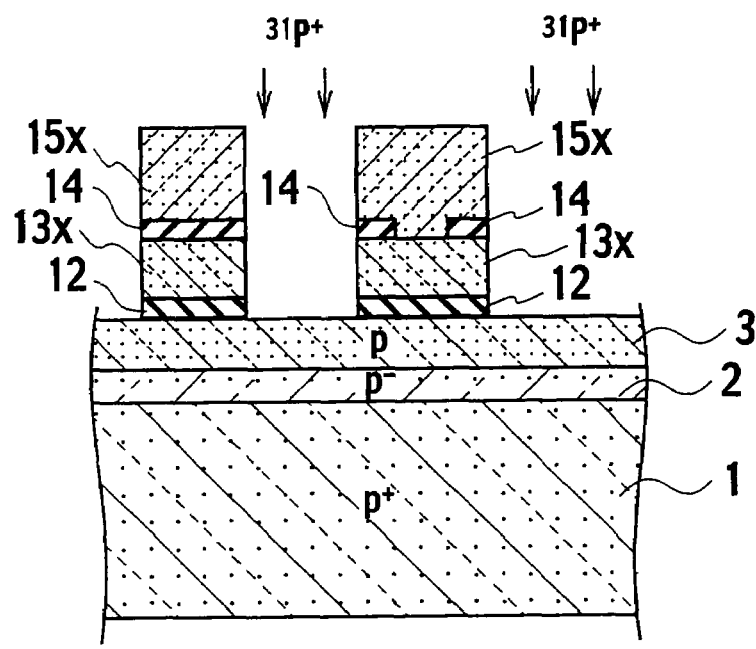
FIG. 32 is a cross-sectional view showing an example of a method for manufacturing the non-volatile semiconductor memory according to a tenth modification of the present invention.
Figure 33:
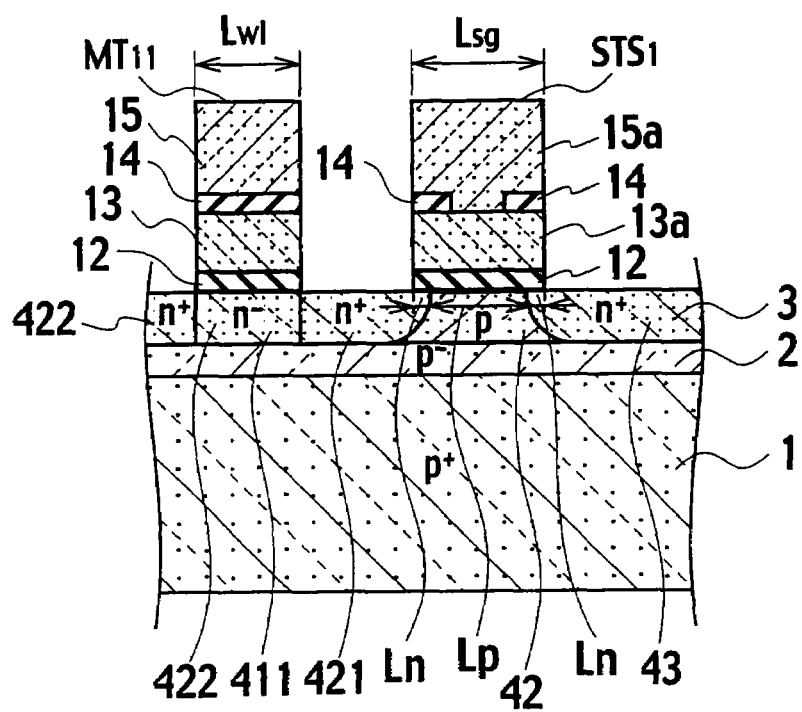
FIG. 33 is a cross-sectional view after the process of FIG. 32 showing the method for manufacturing the non-volatile semiconductor memory according to the tenth modification of the present invention.

Then, as shown in FIG. 32, the n-type impurities, such as $^{31}P^+$, are ion-implanted in a self alignment manner by using the second polysilicon layer 15 as a mask, followed by the thermal treatment. As a result, the n-type impurity ions of the third semiconductor layer 3 are activated, and as shown in FIG. 33, the $n^+$-type source and drain regions 421 and 422 and source regions 43 are formed. Furthermore, the n-type impurity ions are diffused, and the $n^-$-type channel regions 411 are formed in the n-type channel layer immediately under the floating gate electrodes 13. In a similar way, the $n^+$-type source and drain regions 423 to 42(n+1) and the $n^-$-type channel regions 412 to 41n, which are shown in FIG. 1, are formed. The n-type impurity ions are diffused, and the source and drain regions 421 and the source regions 43 are expanded immediately under the select gate electrodes 13a and 15a by a length $L_n$. Here, it is satisfactory if a length $L_{w1}$ of the control gate electrodes 15 of the memory cell transistor $MT_{11}$ is set shorter than a length $2L_n$ by which the source and drain regions 421 and the source regions 43 are expanded, and if a length $L_{sg}$ of the select gate electrodes 13a and 15a is set to be longer than the length $2L_n$ by which the source and drain regions 421 and the source regions 43 are expanded.

As shown in FIG. 13A, it is difficult to ion-implant the p-type impurities into a part of the length $L_p$ of the n-type channel layer which forms the select gate transistor $STS_1$. As opposed to this, according to the tenth modification, the ion implantation is performed in the self alignment manner by using the second polysilicon layer 15 as a mask as shown in FIG. 33, followed by the thermal treatment. Therefore, a dimensional margin of the length $2L_n$ is obtained in the case of forming the p-type channel length $L_p$. Therefore, it is possible to form the p-type channel regions 42 immediately under the select gate electrodes 13a and 15a easily. Note that it also becomes possible to form the p-type channel regions 44 immediately under the select gate electrodes 13b and 15b of the select gate transistor $STD_1$, shown in FIG. 1, easily in a similar way.

(Eleventh Modification)

Figure 34:
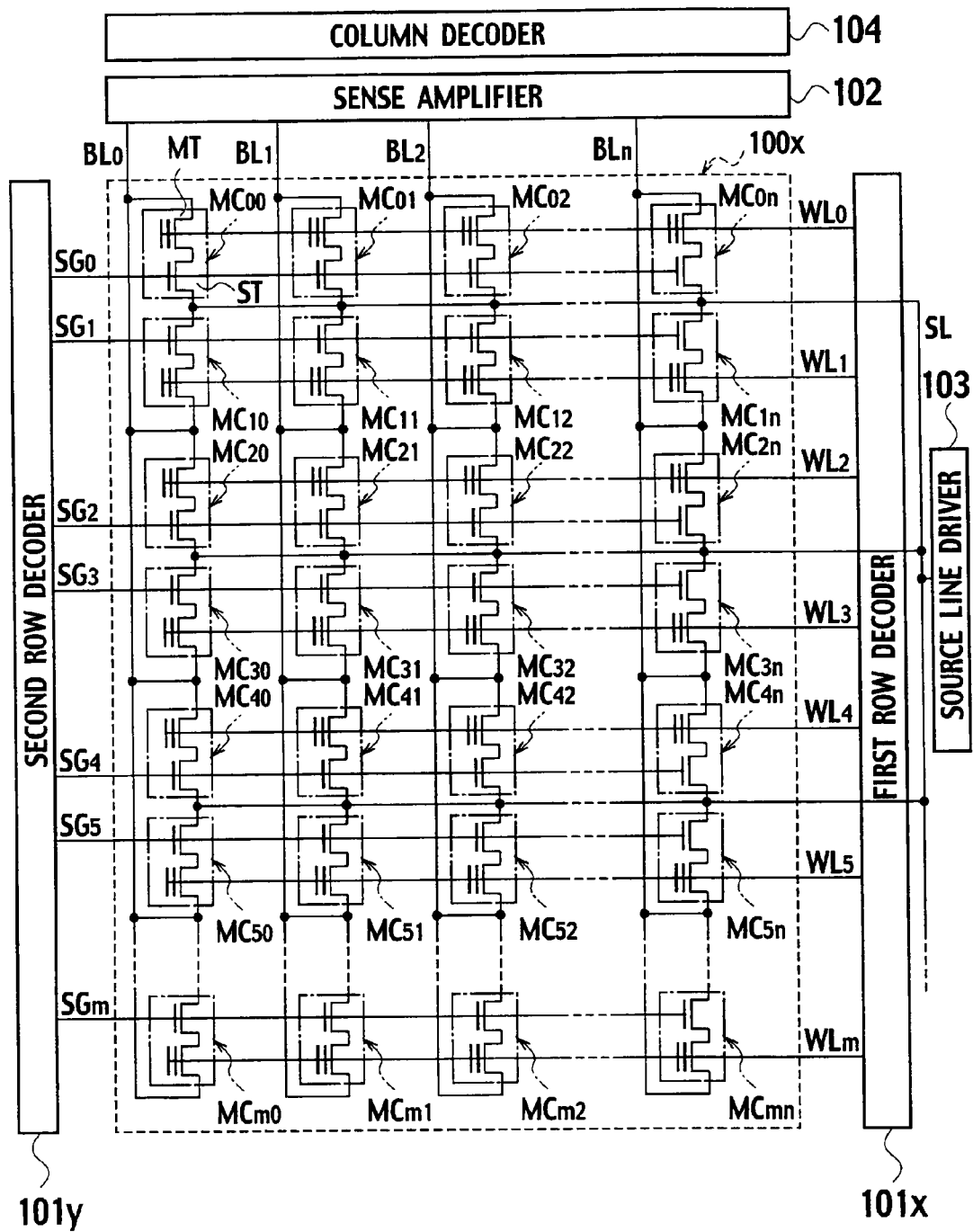
FIG. 34 is a cross-sectional view in the column direction showing an example of a cell array of a non-volatile semiconductor memory according to an eleventh modification of the present invention.

As shown in FIG. 34, a non-volatile semiconductor memory according to an eleventh modification of the present invention may have a two-transistor cell structure which is an expansion of a planar pattern structure of a one-transistor cell structure shown in FIG. 2. The non-volatile semiconductor memory shown in FIG. 34 comprises a cell array 100x, a column decoder 104, a sense amplifier 102, a first row decoder 101x, a second row decoder 101y and a source line driver 103.

The cell array 100x comprises a plurality ((m+1)×(n+1)) of memory cells $MC_{00}$ to $MC_{mn}$. Each of the memory cells MC includes a memory cell transistor MT and a select transistor ST. A current pathway is connected in series in each of the cell transistor and the select transistor. The memory cell transistor MT comprises a stacked gate structure including: a floating gate electrode formed above a semiconductor substrate with a gate insulating film interposed between the floating gate electrode and the semiconductor substrate; and a control gate electrode formed above the floating gate electrode with an inter-electrode insulating film interposed between the control gate electrode and the floating gate electrode. A source region of the memory cell transistor MT is connected to a drain region of the select transistor ST. Each of two memory cells MC adjacent to each other in the column direction share the source region of the select transistor ST or the drain region of the memory cell transistor MT.

The control gate electrodes of the respective memory cell transistors MT of the respective memory cells MC in the same row are commonly connected to one of word lines WL0 to WLm. The gates of the respective select transistors ST of the respective memory cells in the same row are connected to any one of select gate lines SG0 to SGm. The drain regions of the respective memory cell transistors MT of the respective memory cells MC in the same row are commonly connected to one of bit lines BL0 to BLn. The sources of the respective select transistors ST of the respective memory cells MC are commonly connected to a source line SL, and the source line SL is connected to a source line driver 103.

The column decoder 104 decodes a column address signal, thereby obtaining a column address decoded signal. One of the bit lines BL0 to BLn is selected based on the column address decoded signal. The first and second row decoders 101x and 101y decode a row address signal, thereby obtaining a row address decoded signal. The first row decoder 101x selects one of the word lines WL0 to WLn when writing is initiated. The second row decoder 101y selects one of the select gate lines SG0 to SGm when reading is initiated. The sense amplifier 102 amplifies data which have been read out from a memory cell selected by the second row decoder 101y and the column decoder 104. The source line driver 103 supplies a voltage to the source line SL during reading.

According to the eleventh modification, the non-volatile semiconductor memory comprises the two-transistor cell structure, so that the memory cell MC is positively cut off, and thus enabling a reading operation to be performed. In addition, a three-transistor cell structure in which a select transistor ST is connected to both a source region and a drain region for each of the memory cell transistors MT can be easily expanded from the planar pattern shown in FIG. 2.

(Twelveth Modification)

Figure 35:
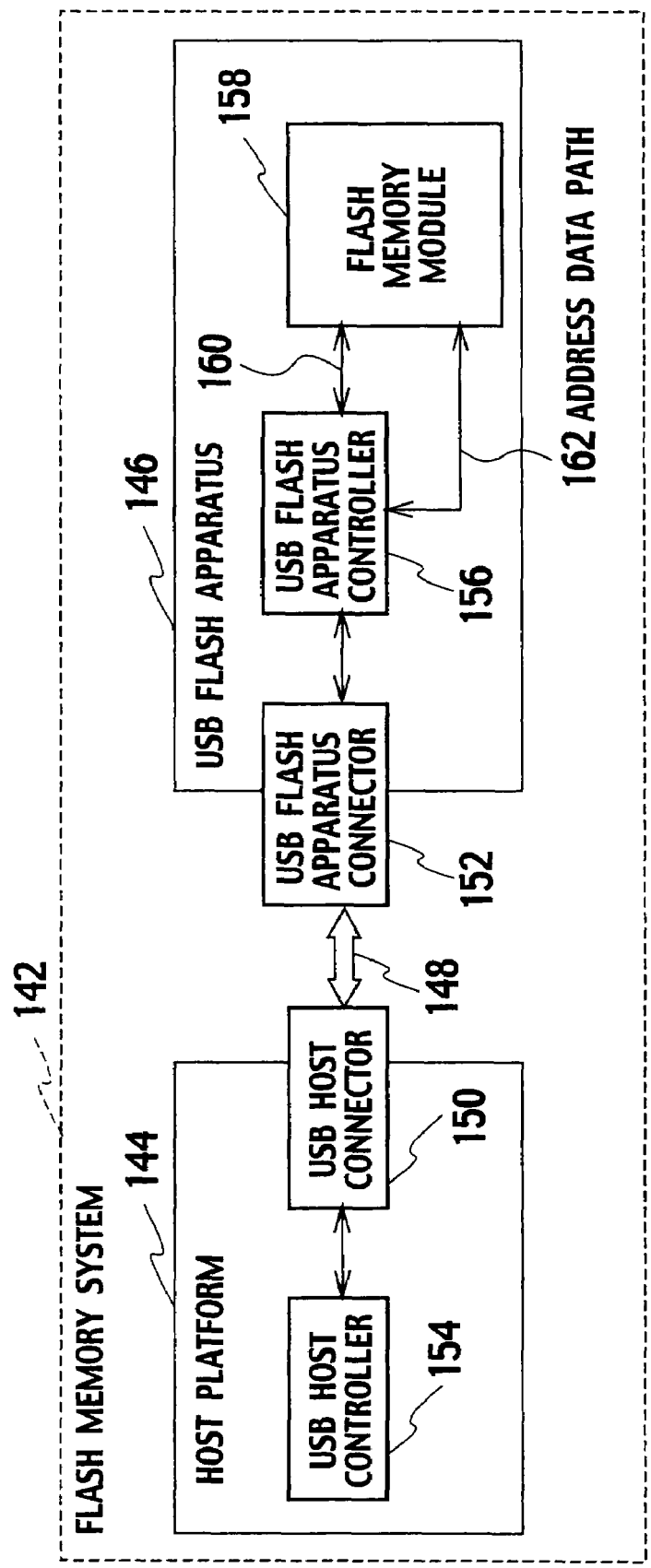
FIG. 35 is a block diagram showing an example of a flash memory system using a non-volatile semiconductor memory according to a twelfth modification of the present invention.

As a twelveth modification of the present invention, a description will be provided for a flash memory system 142, which is an applied example of the non-volatile semiconductor memory shown in FIG. 1, with reference to FIG. 35. The flash memory system 142 comprises a host platform 144 and a universal serial bus (USB) flash device 146. The host platform 144 is connected to the USB flash device 146 through a USB cable 148. The host platform 144 is connected to the USB cable 148 through a USB host connector 150, and the USB flash device 146 is connected to the USB cable 148 through a USB flash device connector 152. The host platform 144 comprises a USB host controller 154 for controlling packet transfer on the USB.

The USB flash device 146 includes: a USB flash device controller 156 for controlling other elements in the USB flash device 146, and for controlling an interface to the USB bus of the USB flash device 146; a USB flash device connector 152; and at least one flash memory module 158 including a non-volatile semiconductor memory according to an embodiment of the present invention.

Once the USB flash device 146 is connected to the host platform 144, a standard USB listing process is started. At this point, the host platform 1414 recognizes the USB flash device 146, and selects a mode of communications with the USB flash device 146. Then, the host platform 144 transmits data to, and receives data from, the USB flash device 146 through an FIFO buffer, referred to as an endpoint, for storing transmitted data. The host platform 144 recognizes changes in physical, electrical conditions such as disconnection and connection of the USB flash device 146 and the like through the endpoint. In addition, if there is a packet to be received, the host platform 144 receives it.

The host platform 144 requests a service from the USB flash device 146 by transmitting a request packet to the USB host controller 154. The USB host controller 154 transmits a packet through the USB cable 148. If the USB flash device 146 has an endpoint which receives this request packet, the requests are received by the USB flash device controller 156.

The USB flash device controller 156 performs various operations such as reading data from the flash memory module 158, writing data to the flash memory module 158, erasing data and the like. In addition, the USB flash device controller 156 supports basic USB functions such as the acquisition of a USB address and the like. The USB flash device controller 156 controls the flash memory module 158 through a control line 160 for controlling output from the flash memory module 158, or, for example, through a read/write signal and various other signals such as a chip enable signal and the like. The flash memory module 158 is also connected to the USB flash device controller 156 through an address data bus 162. The address data bus 12 transfers a read command, a write command and an erase command as well as an address and data in the flash memory module 158.

In order to inform the host platform 144 of a result and the state of various operations requested by the host platform 144, the USB flash device 146 transmits a state packet by use of a state endpoint (endpoint 0). At this point, the host platform 144 checks whether or not there is a state packet, and the SB flash device 146 returns an empty packet or the state packet if there is no new packet of a state message.

According to the twelveth modification, various functions of the USB flash device 146 can be achieved. By eliminating the USB cable 148, the connectors may be connected directly.

Other Embodiments

Various modifications will become possible for those skilled in the art after receiving the teachings of the present disclosure without departing from the scope thereof.

In the embodiment, m×n memory cell transistors $MT_{11}$ to $MT_{1n}$, $MT_{21}$ to $MT_{2n}$, ..., $MT_{m1}$ to $MT_{mn}$ are explained. However, actually, a cell array may be comprised by a larger plurality of memory cell transistors, memory cells and blocks.

Furthermore, in the embodiment, a binary NAND EEPROM is described. However, it is possible to adapt a multi-level storage, for example, a three-level or more storage in the NAND EEPROM.

Furthermore, with regard to an example of a method for manufacturing the non-volatile semiconductor memory according to the embodiment, in the procedure shown in FIGS. 12A and 12B, fluorine (F) or borondifluoride ($BF_2$) may be ion-implanted in the vicinity of the surface of the p-type first semiconductor layer (semiconductor substrate) 1, followed by the thermal treatment thereof, and the second semiconductor layer 2 is thus formed.

Otherwise, in the procedure shown in FIGS. 12A and 12B, a p-type or n-type epitaxial layer is formed on the p-type first semiconductor layer (semiconductor substrate) 1. Subsequently, fluorine (F) or borondifluoride ($BF_2$) may be ion-implanted into the epitaxial layer, followed by the thermal treatment thereof, and the second semiconductor layer 2 is thus formed.

Figure 36:
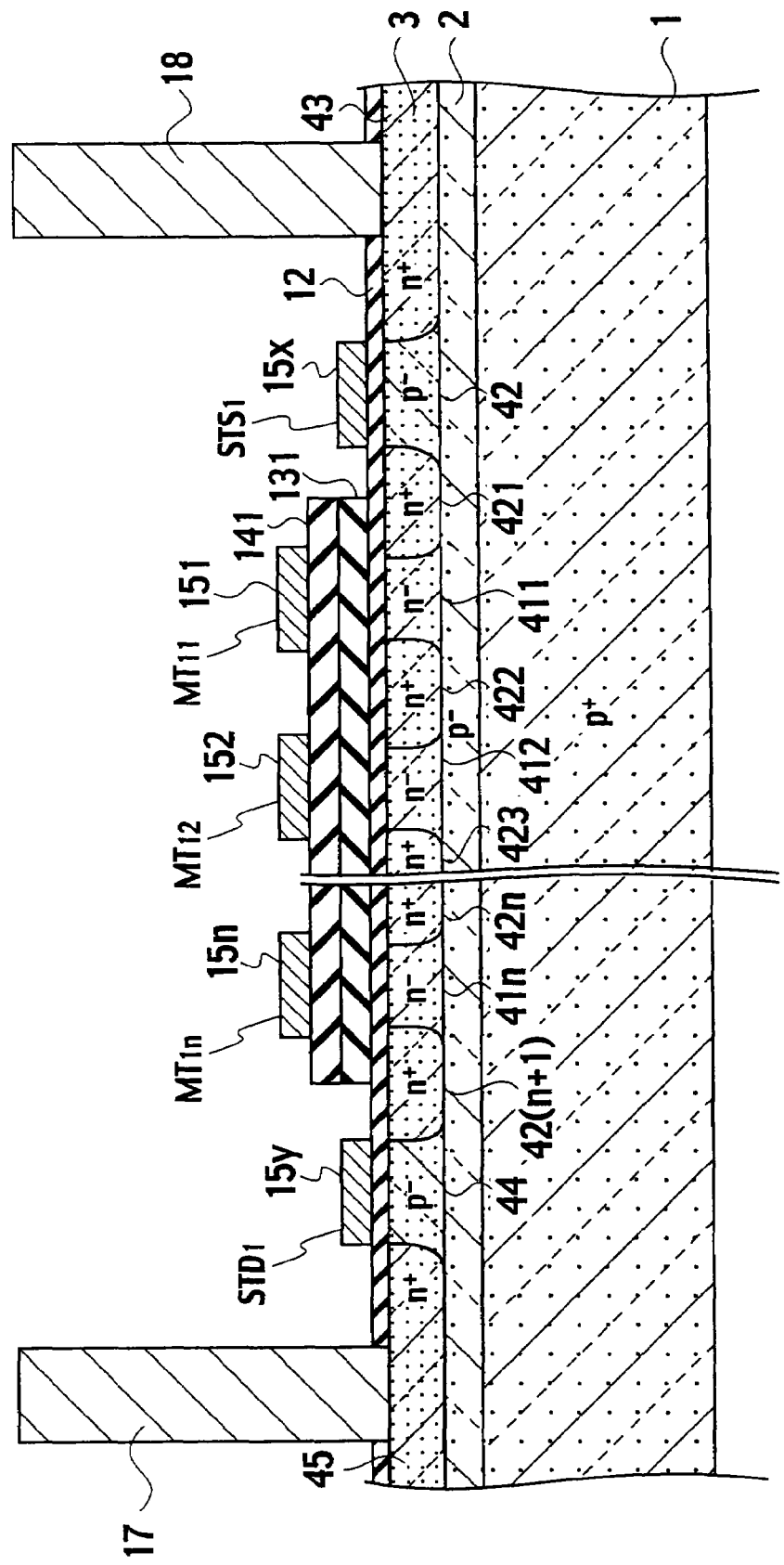
FIG. 36 is a cross-sectional view in the column direction showing an example of a cell array of a non-volatile semiconductor memory according to other embodiment of the present invention.

Furthermore, in the embodiment, a stacked gate structure of the floating gate electrode 13 and the control gate electrode 15 is described, as shown in FIG. 1. However, it is possible to adapt a Metal-Oxide-Nitride-Oxide-Silicon (MONOS) structure, as shown in FIG. 36. The memory cell transistors $MT_{11}$ to $MT_{1n}$ include a tunnel oxide film 12, a nitride film 131, an oxide film 141 and control gate electrodes 151 to 15n. Electrons are trapped by trappes in the nitride film 131 in written operation. The select gate transistors $STS_1$ and $STD_1$ include gate electrodes 15x and 15y, respectively.

Figure 37:
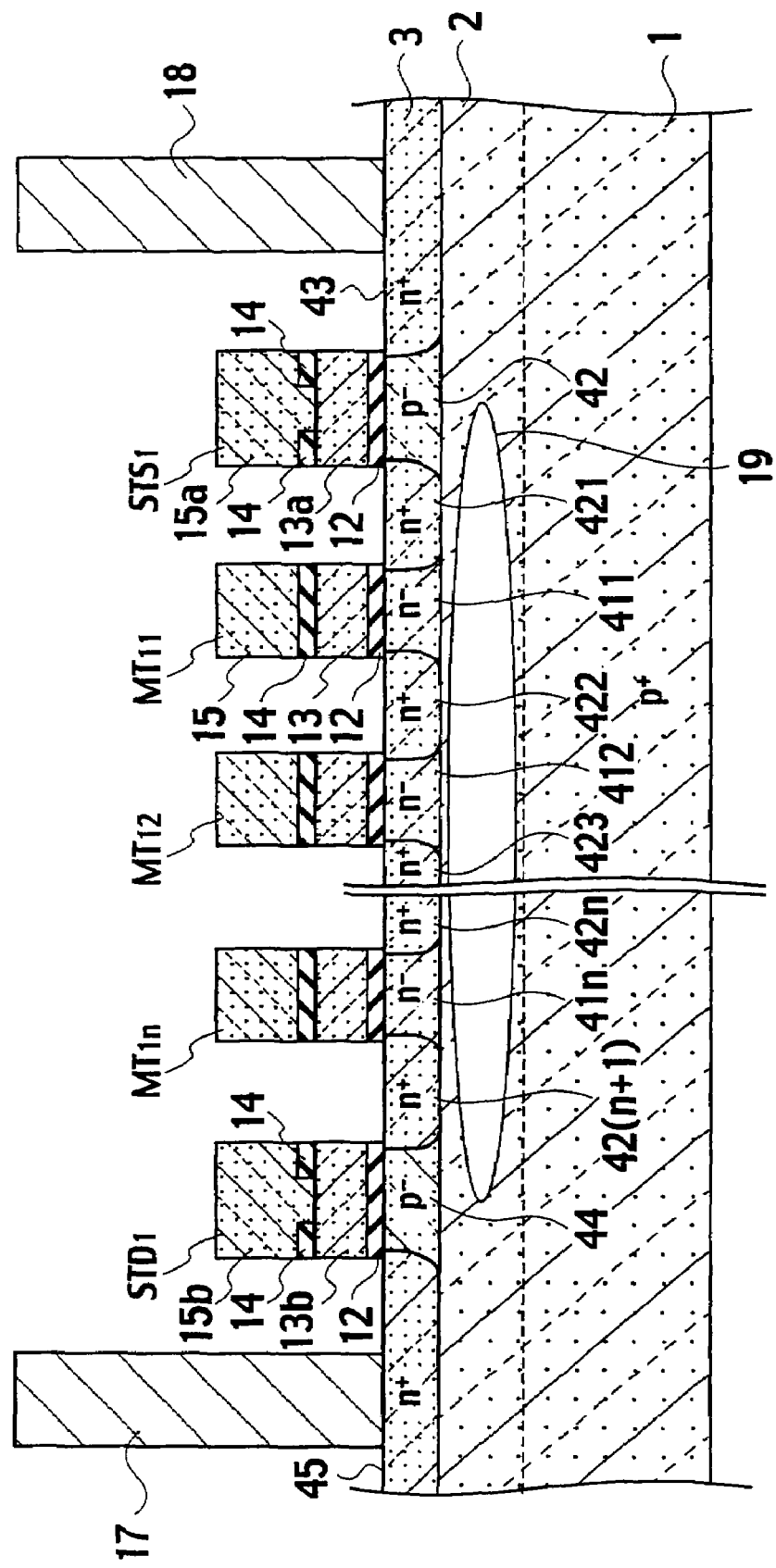
FIG. 37 is a cross-sectional view in the column direction showing another example of a cell array of a non-volatile semiconductor memory according to the other embodiment of the present invention.

Furthermore, in the embodiment, the plurality of vacant spaces 19 are formed in Silicon On Nothing (SON) layer 2, as shown in FIG. 28. However, actually, 1-NAND string has a length of about 3 to 5 μm. Therefore, at least one vacant space 19 may be formed under the memory cell transistors $MT_{11}$ to $MT_{1n}$ between the select gate transistors $STS_1$ and $STD_1$, as shown in FIG. 37.

What is claimed is:

1. A method for manufacturing a non-volatile semiconductor memory comprising:
    forming a second semiconductor layer on a first semiconductor layer having a first conductivity type;
    forming a third semiconductor layer having a second conductivity type on the second semiconductor layer;
    forming a gate insulating film on the third semiconductor layer;
    depositing a first conductive layer on the gate insulating film;
    depositing an insulating film on the first conductive layer;
    depositing a second conductive layer on the insulating film;

forming a groove penetrating the second conductive layer, the insulating layer and the first conductive layer so as to define a control gate electrode, an inter-electrode insulating film under the control gate electrode and a floating gate electrode under the inter-electrode insulating film; and forming a memory cell transistor comprising a source region having the second conductivity type, a drain region having the second conductivity type and a channel region having the second conductivity type in the third semiconductor layer by ion implantation to the third semiconductor layer through the groove.

2. The method of claim 1, further comprising:
forming the first semiconductor layer on a semiconductor substrate before forming the second semiconductor layer.

* * * * *